US009518449B1

(12) United States Patent
Brady et al.

(10) Patent No.: US 9,518,449 B1
(45) Date of Patent: Dec. 13, 2016

(54) WATERFLOODING INJECTATE DESIGN SYSTEMS AND METHODS

(71) Applicant: Sandia Corporation, Albuquerque, NM (US)

(72) Inventors: Patrick V. Brady, Albuquerque, NM (US); James L. Krumhansl, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 548 days.

(21) Appl. No.: 14/055,454

(22) Filed: Oct. 16, 2013

Related U.S. Application Data

(63) Continuation-in-part of application No. 13/226,276, filed on Sep. 6, 2011, now Pat. No. 8,812,271.

(60) Provisional application No. 61/729,726, filed on Nov. 26, 2012.

(51) Int. Cl.
*G06G 7/58* (2006.01)
*E21B 41/00* (2006.01)
*E21B 43/16* (2006.01)

(52) U.S. Cl.
CPC ........... *E21B 41/0092* (2013.01); *E21B 43/16* (2013.01)

(58) Field of Classification Search
CPC .............................. E21B 41/0092; E21B 43/16
USPC .......................................................... 703/10
See application file for complete search history.

(56) References Cited

U.S. PATENT DOCUMENTS

| 7,987,907 | B2 | 8/2011 | Collins et al. |
| 8,439,111 | B2 | 5/2013 | Collins et al. |
| 2009/0308609 | A1 | 12/2009 | Curole et al. |
| 2010/0170453 | A1* | 7/2010 | Betzer-Zilevitch ...... B03D 1/02 122/6 R |
| 2011/0112815 | A1 | 5/2011 | Stukan et al. |
| 2012/0085555 | A1 | 4/2012 | Collins et al. |
| 2012/0090833 | A1 | 4/2012 | Ligthelm et al. |
| 2012/0097389 | A1 | 4/2012 | Dwarakanath et al. |
| 2012/0125603 | A1 | 5/2012 | Willingham et al. |
| 2012/0125604 | A1 | 5/2012 | Willingham et al. |
| 2012/0125605 | A1 | 5/2012 | Willingham et al. |
| 2012/0125644 | A1 | 5/2012 | Zhou |
| 2012/0138316 | A1 | 6/2012 | Matzakos |
| 2012/0227975 | A1 | 9/2012 | Ayirala et al. |

FOREIGN PATENT DOCUMENTS

WO   WO 2010/092097 A1   9/2010

OTHER PUBLICATIONS

M.B. Alotaibi, H.A. Nasr-El-Din, Chemistry of Injection Water and its Impact on Oil Recovery in Carbonate and Clastic Formations Society of Petroleum Engineers (SPE) 2009 SPE 121565, pp. 1-10.*

(Continued)

*Primary Examiner* — Dwin M Craig
(74) *Attorney, Agent, or Firm* — Daniel J. Jenkins

(57) ABSTRACT

A method of recovering a liquid hydrocarbon using an injectate includes recovering the liquid hydrocarbon through primary extraction. Physico-chemical data representative of electrostatic interactions between the liquid hydrocarbon and the reservoir rock are measured. At least one additive of the injectate is selected based on the physico-chemical data. The method includes recovering the liquid hydrocarbon from the reservoir rock through secondary extraction using the injectate.

8 Claims, 12 Drawing Sheets

(56) References Cited

OTHER PUBLICATIONS

Brigitte Bazin; Jean Labrid, "Ion Exchange and Dissolution/Precipitation Modeling: Applictaion to the injection of Aqueous Fluids Into a Resevoir Sandstone" SPE Reservoir Engineering, May 1991, pp. 233-238.*

Brady et al., A surface complexation model of oil-brine-sandstone interfaces at 100° C.: Low 2 salinity waterflooding, Journal of Petroleum Science and Engineering 2011, pp. 171-176, vol. 81, Elsevier B.V.

Brady, Surface Complexation Modeling for Improved Oil Recovery, Eighteenth SPE Improved Oil Recovery Symposium, Apr. 14-18, 2012, 9 pgs, Tulsa, OK, USA.

Brady et al., Why Oil Sticks to Limestone, Submitted to: Journal of Petroleum Science and Engineering, Dec. 4, 2011, 26 pages.

Gan et al., "Coagulation of bitumen with kaolinite in aqueous solutions containing Ca2+,Mg2+ and Fe3+: Effect of citric acid," Journal of Colloid and Interface Science, 2008, pp. 85-91, vol. 324, Elsevier Inc.

Hiorth et al., The Impact of Pore Water Chemistry on Carbonate Surface Charge and Oil Wettability, Transp Porous Media, 2010, pp. 1-21, vol. 85, No. 1, Springer Science+Business Media B.V.

Pu et al., Application of Coalbed Methane Water to Oil Recovery by Low Salinity Waterflooding, 6th SPE/DOE improved oil recovery symposium 2008 : "IOR: now more than ever," Apr. 19-23, 2008, 11 pgs, Tulsa, OK, USA.

Thompson et al., Surface Electrical Properties of Calcite, The Calcite Surface, Journal of Colloid and Interface Science Aug. 1989, pp. 74-82, vol. 131, No. 1, Academic Press, Inc.

Van Cappelle et al., A surface complexation model of the carbonate mineral-aqueous solution interface, Geochimica et Cosmochimica Acta, 1993, pp. 3505-3518, vol. 57, Pergamon Press Ltd., USA.

Villegas-Jimenez et al. Proton/calcium ion exchange behavior of calcite, Physical Chemistry Chemical Physics, Oct. 21, 2009, pp. 8895-8912, vol. 11, No. 39, Owner Societies.

Brady and Krumhansl, "A surface complexation model of oil-brine-sandstone interfaces at 100° C.: Low salinity waterflooding", Journal of Petroleum Science and Engineering, vol. 81, 2012, pp. 171-176.

* cited by examiner

WATERFLOODING INJECTATE DESIGN SYSTEMS AND METHODS

CROSS-REFERENCE TO RELATED APPLICATIONS

This application is a Continuation-in-Part Application of U.S. patent application Ser. No. 13/226,276, entitled "Waterflooding Injectate Design Systems and Methods", filed Sep. 6, 2011, and claims priority to U.S. Provisional Patent Application No. 61/729,726, entitled "WATERFLOODING INJECTATE DESIGN SYSTEMS AND METHODS", filed Nov. 26, 2012 both of which are herein incorporated by reference in its entirety.

STATEMENT OF GOVERNMENT RIGHTS

This invention was developed under Contract DE-AC04-94AL85000 between Sandia Corporation and the U.S. Department of Energy. The U.S. Government has certain rights in this invention.

BACKGROUND

1. Field

Embodiments of the invention relate generally to recovering liquid hydrocarbons from subterranean reservoir with an injectate, and more particularly to methods and systems to design the injectate to reduce surface complexation between interfaces of the liquid hydrocarbon and reservoir rock.

2. Background Information

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Oil, petroleum, tars, other liquid fossil fuels, and other liquid hydrocarbons are contained in, and recovered from, subterranean or underground formations. To access these liquid hydrocarbons, wells are typically drilled from the surface down into the subterranean formations, and the liquid hydrocarbons are recovered through the wells.

Initially, the liquid hydrocarbons may be recovered through primary extraction. Primary extraction may use natural reservoir pressure to force the liquid hydrocarbons into the well. However, typically not all of the liquid hydrocarbons may be recovered through primary extraction. At some point, residual liquid hydrocarbons may be held too tightly within the subterranean formation (e.g., due to adhesive interactions between the oil and the rock) and may be unrecoverable or practically unrecoverable through primary extraction. Often the amount of remaining liquid hydrocarbons may be significant, for example around half of the original oil or other liquid hydrocarbons.

Secondary extraction is commonly used in order to recover some of the remaining liquid hydrocarbons. A common form of secondary extraction involves injecting a medium known as an injectate, such as water (e.g., seawater or terrestrial water) or gas (e.g., carbon dioxide), into the subterranean reservoir in order to mobilize and recover additional liquid hydrocarbons.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
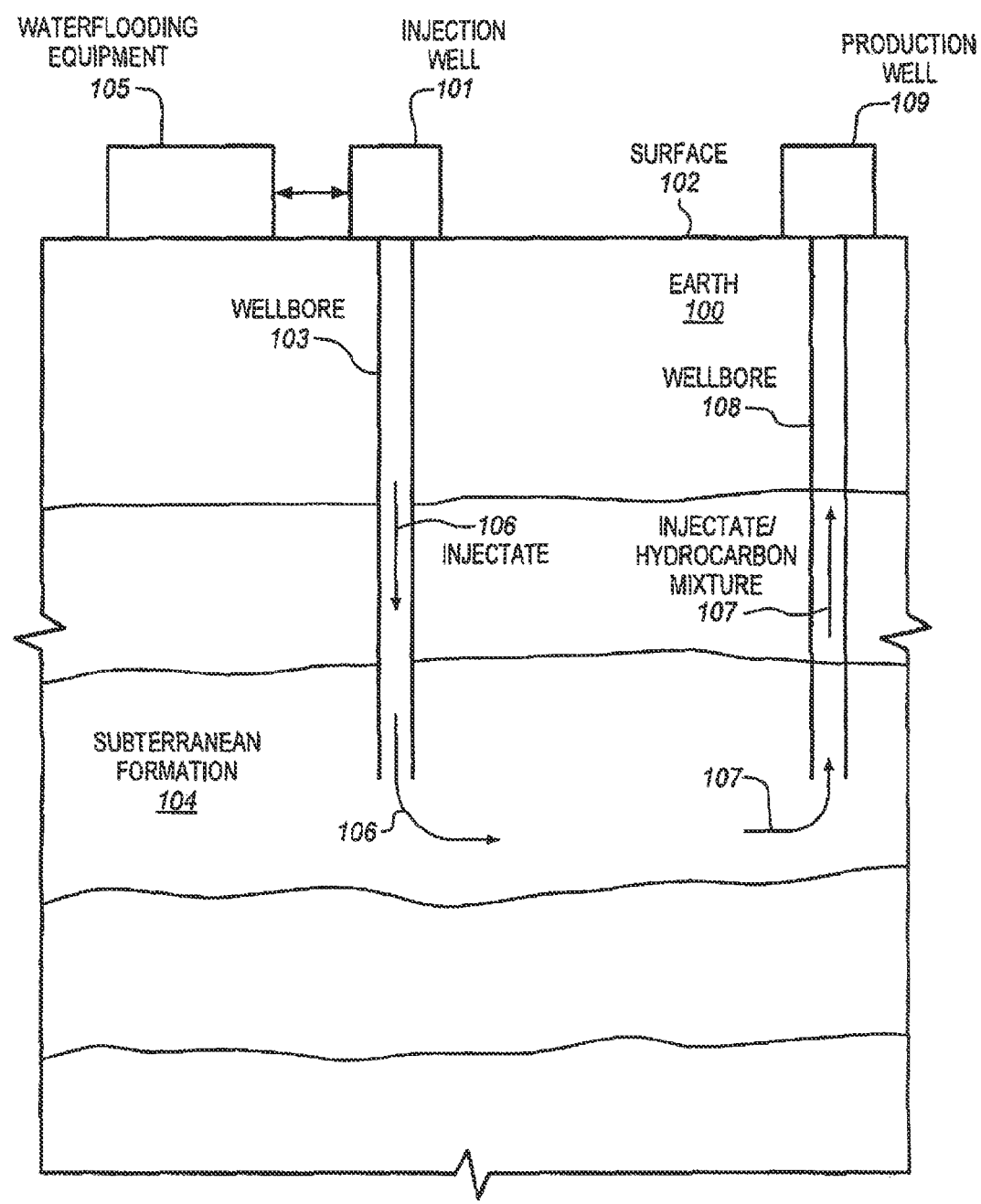
FIG. 1 is a cross-sectional side view illustrating an example of a waterflooding procedure using an injectate designed in accordance with the present disclosure.

Disclosed herein are new and useful methods, apparatus, systems, and other features for designing an injectate used in a waterflooding operation operable to reduce surface complexation or adhesive interactions between interfaces of a liquid hydrocarbon and rock of a subterranean reservoir. Turning now to the figures, FIG. 1 is cross-sectional side view illustrating an example of a waterflooding procedure. An injection well 101 resides on a surface 102 of the earth 100. An injection wellbore 103 extends from the injection well 101 into a subterranean formation 104. The subterranean formation may be, for example, sedimentary rock (e.g., sandstone, siltstone, etc.), carbonate (e.g., limestone, dolomite, etc.) or another portion of the earth having oil, petroleum, tars, other liquid fossil fuels, or other liquid carbonaceous fuels or hydrocarbons, contained within pores or openings thereof.

During a waterflooding procedure, waterflooding equipment 105 may be used to pump, inject, or otherwise introduce liquid injectate 106 (e.g., seawater or terrestrial water) under pressure through the injection well 101 into the injection wellbore 103 and down into the subterranean formation 104. Without limitation, the waterflooding equipment 105 may include a high pressure pump, storage tanks, storage trucks, piping, etc. The injectate 106 may mobilize and drive a portion of the remaining liquid hydrocarbons toward the production well 109. An injectate/hydrocarbon mixture 107 (also including some aqueous connate fluid natively present in the subterranean formation along with the hydrocarbon) may be recovered through a production wellbore 108 and the production well 109.

Traditionally, the liquid injectate used for waterflooding has typically been substantially unmodified seawater or terrestrial water (e.g., from lakes, streams, or wells), which is available at the site of the injection well 101. However, as discussed in detail below, in accordance with the present disclosure, the injectate 106 may be designed so as to disrupt one or more interactions between the liquid hydrocarbon and the subterranean formation 104, which may include a variety of different clays, rock formations, and so on. The injectate 106 may be designed using, among other things, a model that theoretically estimates a degree of interaction between the hydrocarbon and the subterranean formation 104, and also estimates the degree to which the injectate 106 may disrupt one or more of these interactions. As discussed below with respect to FIG. 2, such a model may be implemented as all or a part of an injectate design and generation system.

I. Injectate Design and Generation System

Figure 2:
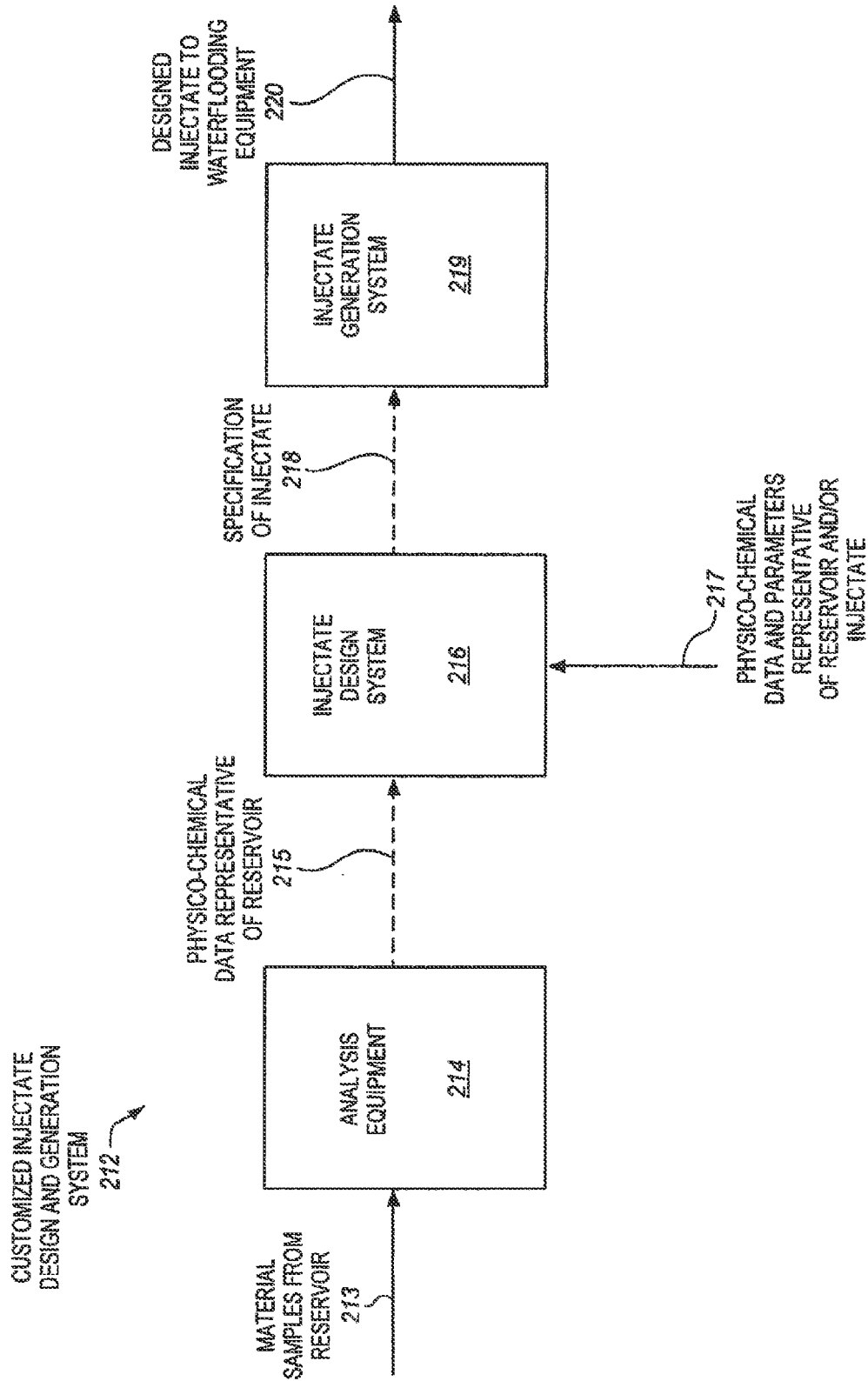
FIG. 2 is a block diagram of an example embodiment of a customized injectate design and generation system.

FIG. 2 is a block diagram of an example embodiment of a customized injectate design and generation system 212 used to generate, for example, the injectate 106 of FIG. 1. The system includes analysis equipment 214, an embodiment of an injectate design system 216, and an injectate generation system 219.

In some embodiments, material samples 213 from a subterranean reservoir may be provided to the analysis equipment 214, although this is not required for other embodiments. By way of example, the material samples may include samples of liquid hydrocarbons from the reservoir, samples of connate water from the reservoir, samples of rock from the reservoir (e.g., sand, clays, mineral carbonates), or any combination thereof. The analysis equipment may include chemical analysis equipment (e.g., a pH meter, equipment to measure ionic strength, equipment to measure concentrations of carboxylic acids and nitrogen bases), physical analysis equipment (e.g., equipment to measure porosity), or any combination thereof.

The analysis equipment may analyze the material samples to obtain physico-chemical data representative of the reservoir. As used herein, physico-chemical data includes physical and/or chemical data. By way of example, the physico-chemical data may include, but is not limited to, a concentration of organic acids (e.g., carboxylic acids) in the liquid hydrocarbon, a concentration of organic bases (e.g., amines and other nitrogen bases) in the liquid hydrocarbon, a pH of the connate, a pH buffer capacity of the connate, an ionic strength of the connate, a concentration of calcium cations ($Ca^{2+}$), magnesium cations ($Mg^{2+}$), and/or sulfate anions ($SO_4^{-2}$) of the connate, a characteristic of rock of the reservoir (e.g., sandstone, carbonate, clay content, kaolinite content, basal plane charge of a clay), or any combination thereof.

The analysis equipment 214 may provide the physico-chemical data 215 representative of the subterranean reservoir to the injectate design system 216. As shown by the dashed line representing the physico-chemical data, in some embodiments the analysis equipment may have an output that is coupled with an input of the injectate design system, such as, for example, by an electrical communication link (e.g., a wire, cable, network connection), a wireless communication link, etc., although this is not required. The injectate design system may also receive physico-chemical data and parameters 217 representative of the reservoir and/or an injectate from another source, such as, for example, by a practitioner manually entering the data through a user data input device, from a network connection, from a database, etc. It is to be appreciated that analysis equipment 214 may not be required if the physico-chemical data is otherwise available (e.g., from previous reports, previous analysis, by estimating the data with data from similar reservoirs).

The injectate design system 216 may design an injectate based at least in part on the data 215, 217. In designing the injectate, the system may be operable to customize, tailor, optimize, or otherwise design the injectate based on the particular reservoir characteristics so that it is operable to reduce the extent of "adhesive" surface complexation between interfaces of the liquid hydrocarbon and reservoir rock. By reducing these adhesive interactions, the injectate may be operable to increase mobility of the liquid hydrocarbon and/or improve a waterflooding operation (e.g., increase oil recovery, reduce the amount of injectate needed to achieve a given recovery).

Designing the injectate may include designing one or more of a pH of the injectate, an ionic strength of the injectate, a concentration of one or more salts, a concentration of divalent ions (e.g., calcium cations ($Ca^{2+}$), magnesium cations ($Mg^{2+}$), sulfate anions ($SO_4^{-2}$), etc.), a buffer capacity of the injectate, a concentration of additives (e.g., surfactant, aluminum salts, ferric salts, sulfate, bisulfate, silicate, etc.). In some embodiments, additives may be determined for inclusion in the injectate which are operable to reduce chemical bonding between the liquid hydrocarbons and the reservoir rock and/or improve liquid hydrocarbon mobility and/or recovery for a particular subterranean reservoir. However, it should be noted that in certain embodiments, designing the injectate may include removing certain components from the injectate. For example, a waterflooding operation may inject seawater into the reservoir rock. It may be desirable to remove certain components (e.g., sulfates or other ions) from the seawater to achieve a desired injectate chemistry.

The injectate design system 216 may provide a customized, tailored, optimized, or otherwise designed specification of an injectate 218. As shown by the dashed line, in some embodiments the injectate design system may have an output that is coupled with an input of the injectate generation system 219, such as, for example, by an electrical communication link (e.g., a wire, cable, and/or network connection), a wireless communication link, etc., although this is not required. Alternatively, as another option, the designed specification of the injectate 218 may be manually input (e.g., by a practitioner) to the injectate generation system 219.

The injectate generation system 219 may generate a designed injectate 220 according to the received specification of the injectate 218. The injectate generation system may include physical equipment to generate the injectate. By way of example, the equipment may include, but is not limited to, a tank, mixer, chemical additive metering equipment, analysis equipment (e.g., a pH meter), a control system, etc. The injectate generation system may provide the designed injectate 220 to a suitable destination, such as, for example, to waterflooding equipment, a storage tank, storage truck, etc.

II. Adhesion of Liquid Hydrocarbon to Reservoir Rock

Figure 3:
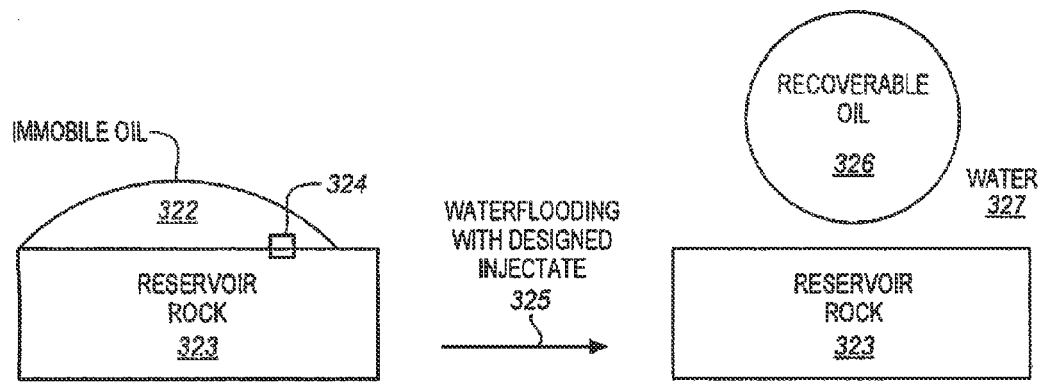
FIG. 3 is a cross-sectional side view illustrating conversion of immobile oil to mobile, recoverable oil with a waterflooding operation with an injectate designed in accordance with the present disclosure.

An injectate designed to improve liquid hydrocarbon recovery may be operable to reduce the adhering interactions between the liquid hydrocarbon and reservoir rock. FIG. 3 is a cross-sectional side view illustrating conversion of immobile oil 322 to mobile, recoverable oil 326 with a waterflooding operation with a designed injectate 325. The immobile oil 322 intimately contacts or wets a surface of a reservoir rock 323. The immobile oil and the reservoir rock chemically coordinate, bond, or interact at a molecular level in a way that renders the oil immobile. The waterflooding operation with the designed injectate is operable to convert the immobile oil to the mobile, recoverable oil by disrupting, altering, reducing, or changing these chemical interactions. As shown as an example in the illustration, water 327 resulting from the injectate may wet the reservoir rock to free the recoverable oil as a discrete droplet that no longer adheres to the reservoir rock. The injectate increases oil recovery by locally decreasing the oil-wettability of the reservoir rock and increasing the water-wettability of the reservoir rock.

Figure 4:
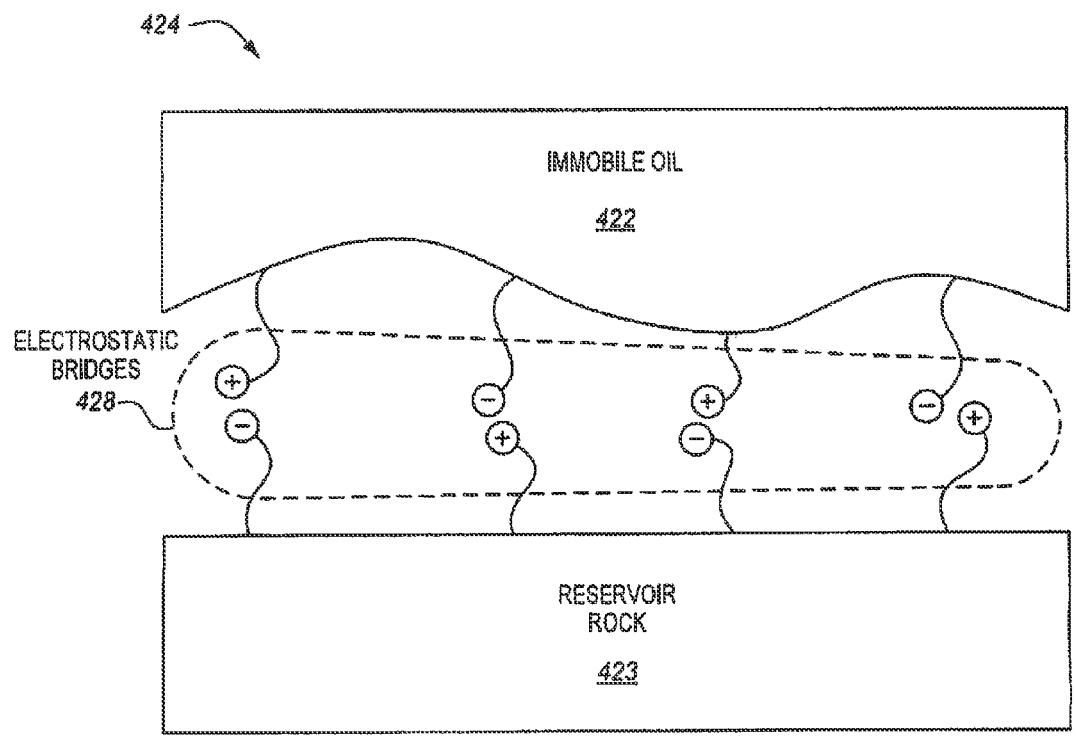
FIG. 4 is a cross-sectional side view of an expanded interfacial region at an interface between immobile oil and reservoir rock which illustrates electrostatic bridges between the immobile oil and the reservoir rock.

FIG. 4 is a cross-sectional side view of an expanded interfacial region 424 at an interface between immobile oil 422 and reservoir rock 423 which illustrates electrostatic bridges 428 between the immobile oil 422 and the reservoir rock 423. The expanded interfacial region 424 corresponds to region 324 of FIG. 3. The electrostatic bridges 428 represent chemical coordinations, bonds, or other chemical adhesion interactions between the immobile oil and the reservoir rock. In the electrostatic bridges, positively (+) and negatively (−) charged molecules dangling from an interface of the immobile oil coordinate electrostatically or otherwise chemically bond with oppositely charged molecules dangling from an interface of the reservoir rock.

By way of example, the positively charged molecules in the immobile oil may represent oil molecules with protonated amine or other nitrogen base groups (e.g., $-NH^+$), and the negatively charged molecules in the immobile oil may represent oil molecules with carboxylate groups (e.g., $-COO^-$). Representatively, the negatively charged species of the reservoir rock may represent anionic mineral surface groups, while the positively charged species of the reservoir rock may represent anionic mineral surface groups bonded to divalent cations.

The electrostatic bridges 428 may represent relatively strong, anhydrous, oil-reservoir rock bonds or interactions that hinder recovery of the oil. Injectates of embodiments may be designed to break these electrostatic bridges and/or create electrostatic repulsion between the oil-water and rock-water interfaces, which may help to facilitate water wetting of the rock interface and/or mobilization of the oil. When the oil-water and rock-water interfaces possess the same charge, this may cause repulsive forces that allow water to become disposed between the oil and the rock, which may tend to facilitate oil recovery.

III. Injectate Design System

Figure 5:
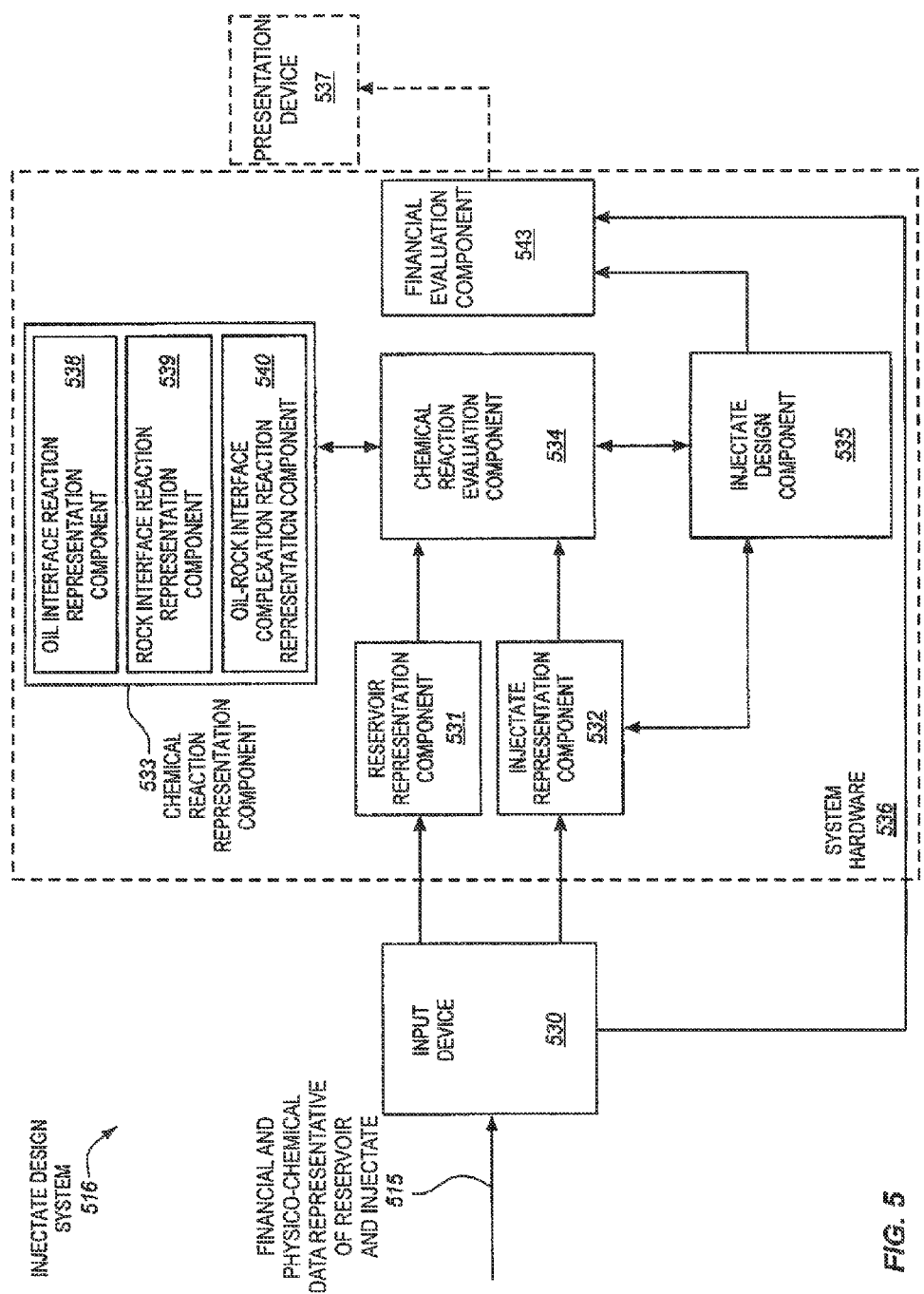
FIG. 5 is a block diagram of an example embodiment of an injectate design system.

FIG. 5 is a block diagram of an example embodiment of an injectate design system 516. The injectate design system may be used to represent and evaluate the affect of an injectate (e.g., injectate chemistry) on oil-rock interactions and/or oil mobility and design an injectate, for a particular reservoir, liquid hydrocarbon, and connate, to decrease the oil-rock interactions and increase oil mobility. The use of the injectate design system is not limited to designing an injectate. In other embodiments, the system may be used for other purposes, such as, for example, to analyze or determine where a waterflooding operation with an injectate will, or will not work, and/or to estimate additional expected recovery for a given waterflooding operation and/or a given injectate (e.g., for economic evaluation or forecasting).

The injectate design system 516 includes an input device 530, a subterranean reservoir representation component 531, an injectate representation component 532, chemical reaction representation component 533, a chemical reaction evaluation component 534, an injectate design component 535, and an presentation device 537. These components may be housed within, for example, system hardware 536.

The input device 530 is operable to receive or provide financial and physico-chemical data 515 representative of a subterranean reservoir and/or an injectate. For example, the financial data may include prices of oil and other commodities, derivatives of the price (e.g., futures contracts), predicted inflation rates, interest rates, and other inputs for financial models. In some embodiments, the input device 530 may be a keyboard having alphanumeric keys to receive the input, cursor control device (e.g., a mouse to receive the input by mouse movements and clicks). Alternatively, the input device may be of another type, such as a network interface, input/output port, communication link with analysis equipment, etc.

Certain physico-chemical data may remain relatively constant over time (e.g., static data). Examples of static data may include oil chemistry (e.g., acid number, base number, asphaltene content, viscosity), connate water chemistry (e.g., pH, hardness, salinity, sulfate concentration, alkalinity), reservoir mineralogy and physics (e.g., modal mineral abundances, porosity), a form of primary decline curve (e.g., estimated primary oil recovery over time), and/or a form of secondary decline curve (e.g., estimated secondary oil recovery over time). The static data may vary slightly over time (e.g., less than 5 or 10 percent), but these small changes generally have a small impact on the injectate chemistry designed by the injectate design system 516. For example, the static data may include inherent characteristics of the reservoir rock or oil that remain relatively constant. As will be appreciated, the static nature of certain data may vary depending on the chemistry of the reservoir rock. For example, certain physico-chemical data may be static in sandstone reservoirs but may not be static in limestone reservoirs. As another example, the static data in a sandstone reservoir and the static data in a limestone reservoir may be different. Accordingly, static data may be considered to be data that remains relatively constant for one particular reservoir. In some embodiments, this static data may be used in the modeling of interactions of many reservoirs that are believed to have similar characteristics. Indeed, in certain embodiments, the input device 530 may receive a baseline set of static data, and the injectate design system 156 may use the baseline data to calculate an injectate chemistry.

On the other hand, certain financial and physico-chemical data may change over time (e.g., dynamic data). The changes in dynamic data may have a substantial impact on the desired injectate chemistry, which in turn, may have an effect on the physico-chemical data. Accordingly, it may be desirable to continuously (e.g., substantially continuously, such as on a periodic basis) recalculate the injectate chemistry using the most up-to-date financial and/or physico-chemical data. Examples of physico-chemical dynamic data may include recovered water chemistry (e.g., pH, hardness, salinity, sulfate concentration, alkalinity), oil chemistry, oil and water permeability, and oil to water ratio. Examples of financial dynamic data may include injectate preparation and treatment costs, and/or other market data. The input device 530 iteratively gathers dynamic data (e.g., once per second, once per minute) for the injectate design system 516. Certain embodiments may design the injectate chemistry based on the dynamic data, the static data, or both.

The various components of the injectate design system 516 are described in further detail below. The subterranean reservoir representation component 531 and the injectate representation component 532 are each coupled or in communication with the input device 530. The subterranean reservoir representation component is operable to store or include a representation of a subterranean reservoir. The representation may include the aforementioned types of physico-chemical data representing chemical characteristics of a liquid hydrocarbon, a connate, and a rock of a subterranean reservoir, such as, for example, nitrogen base and carboxylic acid content of the oil, connate pH, connate buffer capacity, etc. The injectate representation component is operable to store or include a representation of the injectate. The representation of the injectate may include the aforementioned types of physico-chemical data describing the injectate (e.g., pH, ionic strength, buffer capacity, etc.). Each may potentially include at least some of the physico-chemical data received through the input device.

The chemical reaction representation component 533 is operable to represent a set of chemical reactions that affect electrostatic bridging reactions, surface coordination or complexation reactions, or other chemical bonding interactions between the liquid hydrocarbon and the reservoir rock. As shown in the illustrated embodiment, the chemical reaction representation component may include a liquid hydrocarbon interface reaction representation component 538, a rock interface reaction representation component 539, and an oil-rock interface chemical complexation reaction representation component 540. A brief description of these components will be provided at this point, and then detailed example embodiments of each of these components will be provided further below.

The oil or liquid hydrocarbon interface reaction representation component 538 may represent one or more chemical reactions involving charged species at an interface of the oil or liquid hydrocarbon. In some embodiments, the oil or liquid hydrocarbon interface reaction representation component may represent a first acid-base equilibrium chemical reaction for protonation of nitrogen base groups of the liquid hydrocarbon, and a second acid-base equilibrium chemical reaction for deprotonation of carboxyl groups of the liquid hydrocarbon. The rock interface reaction representation component 539 may represent one or more chemical reactions involving charged species at an interface of the reservoir rock.

Each of these components 538, 539 may be used to, respectively, estimate the number of charged sites at the liquid hydrocarbon-water and reservoir rock-water interfaces as a result of multiple reactions occurring simultaneously and as a function of parameters, such as, for example, pH, ionic strength, temperature, mineralogy, oil surface chemistry (e.g., the number and nature of ionizable groups present), connate and injectate fluid composition (e.g., pH, ionic strength, ion concentrations), and various combinations thereof. Expressing these charged species or sites as a function of such parameters may help to allow evaluating how the number of charged sites and/or the extent of potential adhesion may be altered by an injectate during a water flooding operation, and may allow the composition and chemical attributes of the injectate to be adjusted to chemically favor oil-mineral separation and recovery.

The oil-rock interface chemical complexation reaction representation component 540 may represent one or more surface complexation chemical reactions between the charged species at the interfaces of the liquid hydrocarbon and the rock. This component may represent reactions affecting coordination of charged molecules from the liquid hydrocarbon-water interface to oppositely charged sites at reservoir rock or mineral surfaces. In some embodiments, this component may represent a surface complexation chemical reaction between positively charged protonated nitrogen base groups of the liquid hydrocarbon and negatively charged species of the reservoir rock, and a surface complexation chemical reaction between negatively charged carboxylate groups of the liquid hydrocarbon and positively charged species of the reservoir rock. Specific examples will be provided further below.

The chemical reaction evaluation component 534 is coupled or in communication with the reservoir representation component 531, the injectate representation component 532, and the chemical reaction representation component 533. The reaction evaluation component 534 is operable to evaluate the reactions of the reaction representation component based on the representations of the reservoir and injectate representation components. In some embodiments, the chemical reaction evaluation component may take into consideration other factors such as kinetic considerations, transport phenomenon, diffusion models, mineral dissolution and precipitation models, etc. In some embodiments, the reaction evaluation component may include a reaction path evaluation component, which simultaneously calculates the extent of adsorption, aqueous speciation, and mineral dissolution and precipitation, in response to injectate (and/or gas) addition and/or changes in temperature and pressure. An example of a suitable reaction evaluation components of embodiments include, but are not limited to, PHREEQC available from the United States Geologic Survey. Other reaction path evaluation components which take into account either the same, less, more, or different aspects, may alternatively be used as appropriate for the particular implementation.

The injectate design component 535 is coupled or in communication with the chemical reaction evaluation component 534 and with the injectate representation component 532. The injectate design component 535 may receive a result of the evaluation of the chemical reactions and may improve, optimize, or otherwise design the injectate based on the result so that the injectate is operable to reduce an extent of surface complexation between the charged species at the interfaces of the liquid hydrocarbon and the rock. In some embodiments, this may include designing one or more chemical attributes of the injectate, such as, for example, a pH of the injectate, an ionic strength of the injectate, a concentration of one or more salts, a concentration of divalent ions (e.g., calcium cations ($Ca^{2+}$), magnesium cations ($Mg^{2+}$), sulfate anions ($SO_4^{-2}$), etc.), a buffer capacity of the injectate, a concentration of additives (e.g., surfactant, aluminum salts, ferric salts, sulfate, bisulfate, silicate, etc.). In some embodiments, the designed injectate may be a low salinity or so-called low-sal injectate having a salt concentration significantly less than that of seawater. In some embodiments, a combination of chemical attributes of the injectate may be determined to be operable to achieve an optimal or at least high level of liquid hydrocarbon recovery customized to a particular reservoir.

As noted above, the injectate design system 516 may continuously recalculate the injectate chemistry based on dynamic financial and/or physico-chemical data. For example, the injectate design system 516 may include a financial evaluation component 543, coupled to or in communication with the injectate design component 535 and the input device 530. In some embodiments, chemical attributes of the injectate may be changed according to a Monte Carlo method, random walk, or pseudo random walk type method. Results may be evaluated for many different combinations of chemical attributes and the best result(s) and corresponding set(s) of parameters may be identified. In other embodiments, deterministic or more deterministic type methods may be used to change chemical attributes of the injectate and optimize or design the injectate. In still other embodiments, nonlinear optimization algorithms may be used to change chemical attributes of the injectate and optimize or design the injectate. In still further embodiments, chemical attributes of the injectate may be changed and designed manually through interaction with the system hardware (e.g., by way of user input device and processing/computation performed by the system hardware) based on heuristics, collective knowledge, practitioner expertise, or the like. Those skilled in the art and having the benefit of the present disclosure will appreciate that still other ways of designing the injectate are contemplated.

The presentation device 537 is coupled or in communication with the system hardware 536. Results of the evaluations of the waterflooding operations may be provided to the presentation device 537. Examples of suitable presentation devices include, but are not limited to, monitors and other display devices, printers and other hardcopy devices, network connections, or any combination thereof. Another example of a presentation device is a communication link to an injectate generation system.

The reservoir representation component 531, the injectate representation component 532, the chemical reaction representation component 533, the chemical reaction evaluation component 534, the injectate design component 535, and the financial evaluation component 543 may be implemented on system hardware 536. These components may configure the system hardware as a particular injectate design system and/or surface complexation evaluation system. The system hardware may include one or more microprocessors to process data, one or more co-processors (e.g., graphics co-processors, math co-processors, hardware accelerators, etc.) to process data, one or more different types of memory to store data, one or more buses or other interconnects to communicate data between the processors and memory, as well as other types of hardware components. By way of example, reservoir and injectate representation components and the chemical reaction representation component may include data stored in a memory, the chemical reaction evaluation component may receive data from the memory over the interconnects and may evaluate the reactions using hardware circuitry of the one or more processors. In some embodiments, the hardware components may be those of a workstation. In other embodiments, the hardware components may be those of a mainframe.

IV. Injectate Design Method

Figure 6:
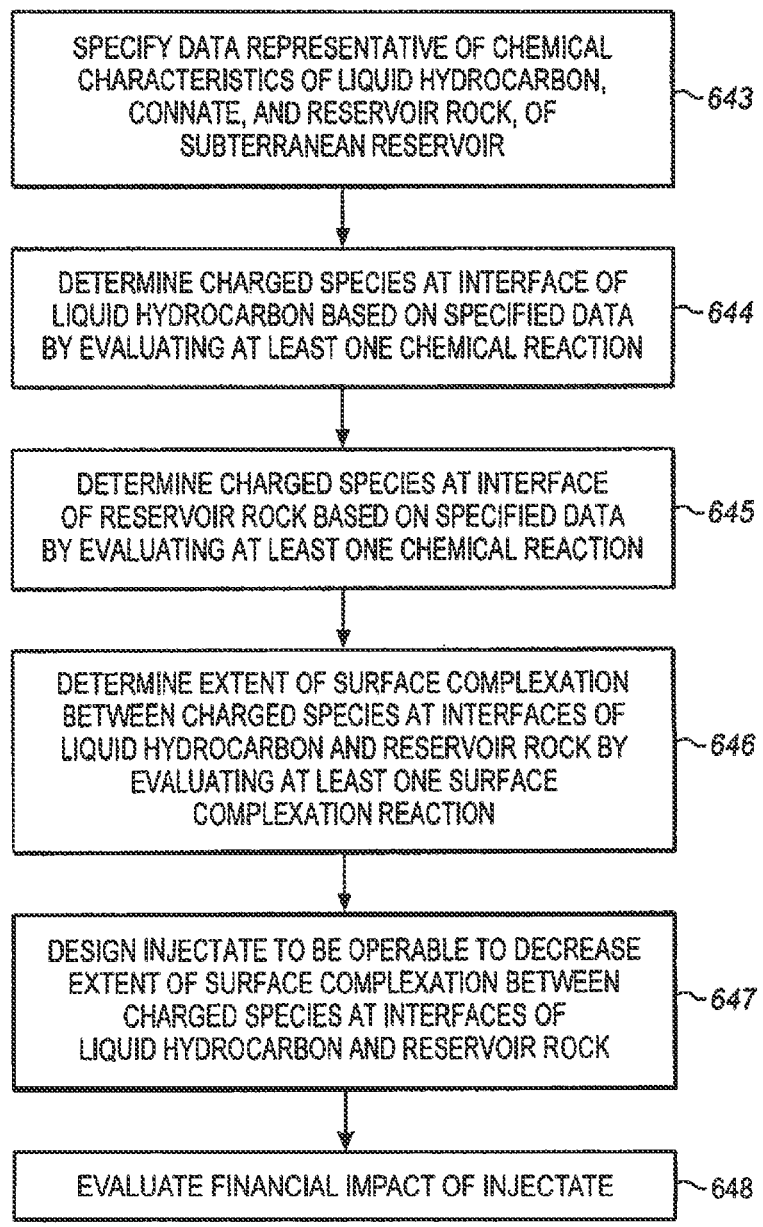
FIG. 6 is a block flow diagram of an example embodiment of a method of designing an injectate to be used in a waterflooding operation.

FIG. 6 is a block flow diagram of an example embodiment of a method 642 of designing an injectate to be used in a waterflooding operation. The method may be implemented on system hardware, such as, for example, one or more processors, one or more memories, one or more buses, of a general-purpose or special-purpose computer system. In some embodiments, the method may be performed by an injectate design system similar to that shown in FIG. 5. Alternatively, the method may be performed by an entirely different injectate design system. Moreover, it is to be appreciated that the injectate design system of FIG. 5 may perform either a similar method, or an entirely different method.

In certain embodiments, the method 642 may be based on a theoretical model that predicts oil recovery based on, for example, the physico-chemical properties of the hydrocarbon, connate, and/or reservoir rock, and not on experimental results. In general, the techniques disclosed herein relate to a predictive theoretical model of electrostatic interactions between the liquid hydrocarbon and the reservoir rock. However, it should be noted that these techniques may be used in combination with empirical data. For example, the method 642 may predict a performance of a specific injectate chemistry. Empirical data may be used to generate a "correction factor" to improve the predictive ability of the theoretical model.

Data representative of chemical characteristics of a liquid hydrocarbon, a connate, and a reservoir rock, of a subterranean reservoir, may be specified, at block 643. For example, the aforementioned different types of financial and physico-chemical data may be specified. The physico-chemical may be used to determine charged species within the reservoir rock and the liquid hydrocarbon. The injectate may subsequently be designed based on the nature and number of charged species, and also based on the financial data.

Charged species at an interface of the liquid hydrocarbon may be determined based on the specified data by evaluating at least one chemical reaction, at block 644. In some embodiments, this may include evaluating a first acid-base equilibrium chemical reaction for protonation of nitrogen base groups of the liquid hydrocarbon, and evaluating a second acid-base equilibrium chemical reaction for deprotonation of carboxyl groups of the liquid hydrocarbon. In this embodiment oil acid and base numbers may be used to estimate the abundance of carboxyl and nitrogen base groups in the oil. In some embodiments, reactions for one or more of divalent cations (e.g., calcium cations, magnesium cations, etc.) and/or anions (e.g., sulfate anions, bicarbonate anions, etc.) may be represented.

Charged species at an interface of the reservoir rock may be determined based on the specified data by evaluating at least one chemical reaction, at block 645. In some embodiments, the charged species may be evaluated for clays, quartz, or other rocks associated with a sandstone subterranean reservoir. For example, in the case of kaolinite, reactions pertinent to edge and potentially basal plane charge may be represented. In other embodiments, the charged species may be evaluated for calcite, dolomite, carbonate, swelling clays (e.g., montmorillonite), or other rocks associated with a mineral carbonate subterranean reservoir. In some embodiments, reactions for one or more of divalent cations (e.g., calcium cations, magnesium cations, etc.) and/or anions (e.g., sulfate anions, bicarbonate anions, etc.) may be represented.

An extent of surface complexation between the charged species at the interfaces of the liquid hydrocarbon and the reservoir rock may be determined by evaluating at least one surface complexation reaction, at block 646. In some embodiments, this may include evaluating a first surface complexation reaction between positively charged protonated nitrogen base groups of the liquid hydrocarbon and negatively charged species of the reservoir rock, and evaluating a second surface complexation reaction between negatively charged carboxylate groups of the liquid hydrocarbon and positively charged species of the reservoir rock. In some embodiments, this may include evaluating a third surface complexation reaction between positively charged calcium carboxylate groups of the liquid hydrocarbon and negatively charged species of the reservoir rock.

The injectate may be designed to be operable to decrease the extent of the surface complexation between the charged species at the interfaces of the liquid hydrocarbon and the reservoir rock, at block 647. For example, the injectate design system may determine the extent to which swelling clays (i.e., clays that change substantially in volume when their water content varies) may be present in a given subterranean reservoir. Thus, it may be desirable to assess the suitability of the injectate for use with the swelling clays. For example, certain ranges of salinity, pH, ionic strength, and the like, may result in minimal or no expansion of the swelling clays upon introduction of the designed injectate, thereby maintaining the structural integrity of the reservoir rock formation. In particular, it may be desirable to assess the ionic strength and a sodium to calcium ratio (e.g., $Na^+$ to $Ca^{2+}$ ratio) of the designed injectate in order to estimate the resulting expansion of the swelling clays.

Additionally or alternatively, the injectate may be designed to dissolve certain minerals, such as calcite and anhydrite, to improve oil recovery. For example, dissolution of reservoir minerals such as calcite and anhydrite by thermodynamically unsaturated waterflood solutions may release additional oil in limestone reservoirs. Accordingly, the injectate design system may perform parallel calculations to estimate mineral dissolution, surface complexation, and reservoir rock expansion. For example, the mineral dissolution calculation may use the physico-chemical properties of the downhole waters (e.g., connate water) to calculate the thermodynamic saturation state of the fluids with respect to dissolvable reservoir minerals. In other words, the calculation may determine whether the downhole water is fully saturated with a certain mineral, and if not, how much additional mineral may dissolve within the downhole water.

However, in certain types of reservoirs, mineral dissolution may have an opposite effect. That is, the dissolution of certain calcium and magnesium-bearing minerals (e.g., dolomite and gypsum) within sandstone reservoirs may have an adverse effect on oil recovery. Particularly with low-salinity injectates, dissolved $Ca^{2+}$ may counteract removal of [—Al:Si—$O^-$][—$COOCa^+$] electrostatic bridges, thereby reducing oil recovery. Therefore, the dissolution of certain minerals (e.g., calcite, anhydrite) improves oil recovery, while the dissolution of other minerals (e.g., dolomite, gypsum) decreases oil recovery. Accordingly, it should be appreciated that the injectate may be designed to promote the dissolution of recovery-improving minerals, while inhibiting the dissolution of recovery-hindering minerals.

After the injectate is designed at block 647, the injectate chemistry is evaluated for financial viability at block 648. This evaluation may include, for example, considering the change in overall oil recovery in response to the injectate, the cost of the materials to prepare the injectate, the market price of oil, and the like.

V. Example Embodiment of Oil Interface Reaction Representation Component

As previously mentioned, in some embodiments, the predominant charged sites at an oil-water interface may be due to acidic and basic groups of organic molecules of the oil. Commonly, these acidic and basic groups may include predominantly carboxylic acid groups and nitrogen base groups. The oil interface reaction representation component may represent reactions involving these carboxylic acid groups and nitrogen base groups. In other embodiments, depending upon the particular oil, additional reactions involving other charged species (e.g., other acidic or basic groups) may be incorporated. The acidic and basic groups most prevalent in a particular oil may be readily determined by well known analytical chemical methods. It also should be appreciated that including reactions for both carboxylic acid groups and nitrogen base groups may not be required if a particular oil has an insignificant amount of one of these types of functional groups.

Measured zeta potentials of oil droplets in water may be approximately modeled as the sum of acid and base groups (e.g., carboxylic acid groups and nitrogen base groups), whose surface acidity constants are roughly equivalent to their aqueous values. The polar nitrogen groups expressed at the oil-water interface tend to be weak bases, are commonly linked to heterocyclic aromatic groups, and generally have 25° C. $pK_a$s in the range of about 5 to 6.5. Temperature may be assumed to have a similar effect on acidic and basic groups exposed at the oil-water interface as it does on monomeric carboxylic acids and weak nitrogen bases (e.g., quinoline, pyridine, or similar nitrogen bases), respectively. Carboxylate deprotonation reactions have enthalpies on the order of around 0 kJ/mol, which means that a temperature increase at constant pH should not significantly affect the charge on a carboxylate group exposed at the oil-water interface. In contrast, the $pK_a$s of weak nitrogen basic groups tend to decrease with increasing temperature. In one aspect, this may be approximated according to the expression $-d(pK_a)/dT(° K)=0.016$. This expression suggests a decrease in the $pK_a$s of the weak nitrogen basic groups of approximately 1.2 units when the temperature increases from 25° C. to 100° C. This corresponds to a reaction enthalpy of approximately 34 kJ/mol.

Figure 7:
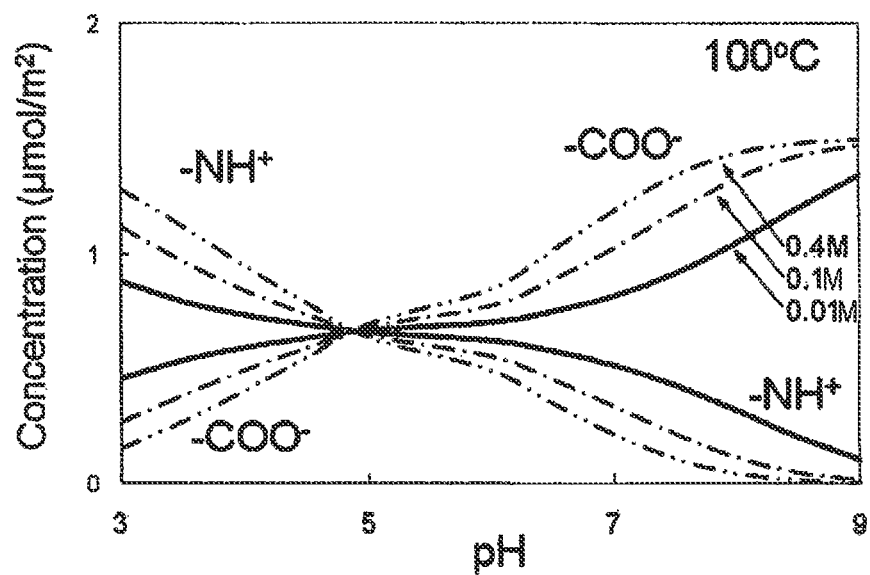
FIG. 7 is a plot of an example of calculated ionic strength-dependent and pH-dependent surface charge of an example embodiment of an oil-water interface.

FIG. 7 is a plot of calculated ionic strength-dependent and pH-dependent 100° C. surface charge of an example embodiment of an oil-water interface having nitrogen base and carboxylate groups that deprotonate as shown in Reactions 1 and 2.

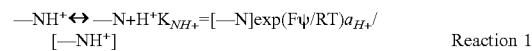

Reaction 1

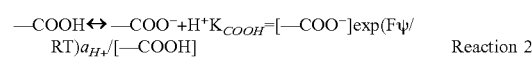

Reaction 2

In Reactions 1 and 2, —COOH and —NH⁺ represent dangling carboxylic acid and protonated nitrogen base groups present at the oil-water interface, respectively. Similarly, —N represents a dangling nitrogen basic group and —COO⁻ represents a dangling carboxylate group. The Ks are equilibrium constants. Bracketed terms are surface concentrations ($\mu$moles/m$^2$), F is Faraday's constant, $\psi$ is the surface potential, $a_{H+}$ is the activity of the hydrogen ion, R is the gas constant, and T is absolute temperature.

In this example embodiment, a diffuse layer model was used to model the electric double layer. The diffuse layer model represents a surface layer with a pH-dependent surface charge and a Gouy-Chapman diffuse layer of counterions. Specifically sorbed ions reside on the surface layer. Temperature-dependent acidity constants were used as input to the diffuse layer model. The NH⁺ and carboxylic acid pKs of this embodiment were set to 4.8 and 5.0, respectively. In alternate embodiments, other models besides the diffuse layer model may be used.

In the calculations of this example embodiment, the nitrogen base and carboxylate groups are assumed to be equal in number and to have a total amount of 3.33 $\mu$mol/m$^2$, equal to a total site density of 2 sites/nm$^2$. In alternate embodiments, the relative proportions of acid and base groups need not be assumed to be equal but rather may be changed according to the particular oil being represented.

In this example embodiment, the oil-water surface area and mass were set to about 10 m$^2$/g and about 100 grams of oil per liter of water. When oil adheres to rock the surface area of the oil-water interface may approximate that of the mineral-water interface. The mineral-water interface surface area may tend to vary widely for different types of reservoir rocks or minerals. The value 10 m$^2$/g selected for this model tends to be a mid-range value for sandstones and tends to be characteristic of clays such as kaolinite. Other values appropriate for other rocks (e.g., mineral carbonates) may be used in other embodiments.

Referring again to FIG. 7, as shown at pH greater than about 4.9, increases in ionic strength increase the number of deprotonated carboxylate groups and interfacial negative charge. At pH less than about 4.9, increases in ionic strength increase the number of protonated nitrogen bases and positive surface charge. Ionic strength has the opposite effect on zeta potentials whose absolute values decrease with increasing ionic strength. Different curves are included for sodium chloride (NaCl) concentrations of 0.4M, 0.1M, and 0.01M.

Exposed interfacial carboxylate groups (—COO⁻) and protonated nitrogen base groups (—NH+) dangling from the oil-water interface may tend to attract oppositely charged ions. Commonly, for (—COO⁻) these ions may include monovalent cations such as Na⁺ and divalent cations such as Ca$^{2+}$. Similarly, for (—NH⁺) these ions may include monovalent anions such as Cl⁻ and divalent anions such as SO$_4^{2-}$. In other embodiments, other types of ions may also be considered, but are generally less prevalent than the aforementioned ions in many oilfield brines. Also, in other embodiments, certain of these ions may not be modeled, such as in situations where they are not present in the reservoir under consideration. In this embodiment it is assumed that electrostatic repulsion should prevent near neighbor pairs of like-charged surface sites and thus make unlikely bidentate coordination of Ca$^{2+}$ and SO$_4^{2-}$, although this aspect may be modeled if desired.

In one embodiment, Ca$^{2+}$ coordination to bitumen carboxylate groups may be approximated by a calcium-carboxylate surface complexation constant equal in value or based on that of a calcium-carboxylate aqueous complex, as shown by Reaction 3.

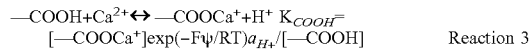

$$\text{—COOH} + \text{Ca}^{2+} \leftrightarrow \text{—COOCa}^+ + \text{H}^+ \quad K_{COOH} = [\text{—COOCa}^+]\exp(-F\psi/RT)a_{H+}/[\text{—COOH}] \quad \text{Reaction 3}$$

The effect of Ca$^{2+}$ on oil-water surface charge may be represented using the reaction shown by Reaction 3 and a log $K_{COOH}$ at 25° C. of approximately −3.8. The effect of temperature on the reaction of Reaction 3 may be approximated by the effect of temperature on the calcium-carboxylate aqueous complexation constant. For example, the enthalpy of the reaction of Reaction 3 may be approximately 1.17 kJ/mol, taken from the Lawrence Livermore National Laboratory thermo.com.V8.R6.230 thermodynamic database for formation of the Ca-acetate complex (similar calculations pointed to only minor sorption of sulfate to dangling amide groups). For the Ca$^{2+}$+H$_2$O ↔ CaOH⁺+H⁺ reaction, the 25° C. log K may be approximated as −12.85, and the enthalpy may be approximated as 18.31 kcal/mole. The log K is derived from the data0.ymp.r5d data base (Yucca Mountain Repository Program 2006). The enthalpy was derived from the 0-100° C. log K grid. The site densities of —NH and COOH groups at the oil-water interface may be as described previously.

Figure 8:
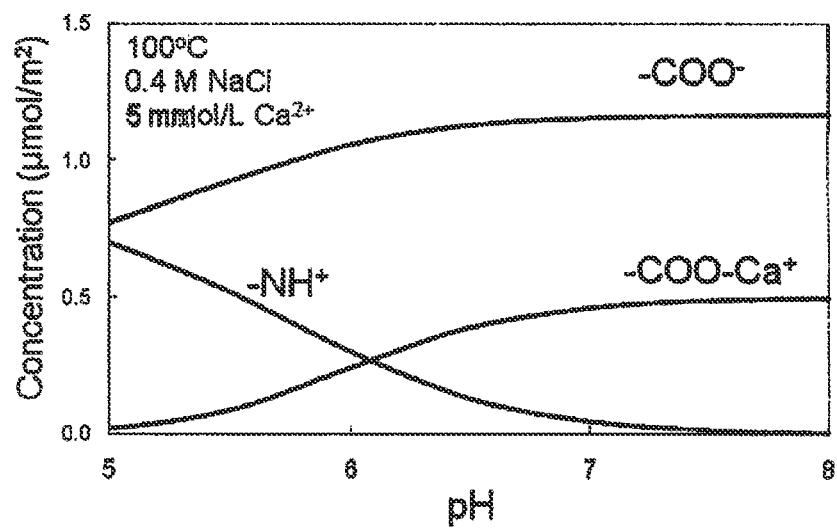
FIG. 8 is a plot of an example of calculated pH-dependent oil-water surface speciation for a brine/oil system showing the effect of divalent calcium ions on oil-water charged surface group abundances.

FIG. 8 is a plot of an example of calculated pH-dependent oil-water surface speciation at 100° C. for a brine/oil system showing the effect of divalent calcium ions (Ca$^{2+}$) on oil-water charged surface group abundances. This embodiment assumes a 9:1 (v/v) brine:oil system with the brine being a 0.4 M NaCl solution containing 5 mmol/L Ca$^{2+}$. As before, the oil surface area was set to 10 m$^2$/g and the total site density to 2 sites/nm$^2$ (one carboxyl site/nm$^2$ and one nitrogen base site/nm$^2$).

Table 1 lists an example embodiment of oil interface reactions and thermodynamic data that may be used to evaluate charged species on oil interfaces.

TABLE 1

Example Embodiment of Oil Interface Reactions Representation

| Reaction | 25° C. log K | Enthalpy (kJ/mol) | Site density ($\mu$mol/m$^2$) |
|---|---|---|---|
| Oil-Water Interface | | | —N: 1.67, —COO 1.67 (can be varied) |
| —NH⁺ ↔ —N + H⁺ | −6.0 | 34 | |
| —COOH ↔ —COO⁻ + H⁺ | −5.0 | 0 | |
| —COOH + Ca$^{2+}$ ↔ —COOCa⁺ + H⁺ | −3.8 | 1.171 | |

VI. Example Embodiment of Rock Interface Reaction Representation Component for Sandstone and/or Clay Containing Reservoirs In some embodiments, the subterranean reservoir may be in a sandstone formation, and oil adhesion to sandstone minerals may be evaluated in developing a suitable injectate. Sandstone reservoir mineral surface chemistry may be approximated as a sum of quartz, feldspar, and clay surface chemistry, plus that of any metal oxide or hydroxide coatings. For a given mineral, the charge may be the net of pH-dependent protonation/deprotonation reactions and cation/anion sorption reactions. The surface reactivity of clays often dominates, in part, because of small grain size, high specific surface areas, and because their morphology provides a high concentration of unsatisfied bonds at sheet edges. Clay surface charge may include a sum of edge and basal plane charge, the latter caused by heterovalent substitution in the lattice. Kaolinite is a common clay in sandstones. Although pure kaolinite has no heterovalent substitution, and correspondingly no significant basal plane charge, impurities may cause natural kaolinites to possess measurable basal plane charge, which will be considered further below. The edge charge depends on pH and may be represented by the following protonation/deprotonation reactions:

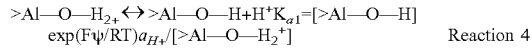

Reaction 4

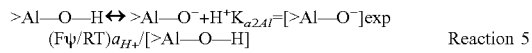

Reaction 5

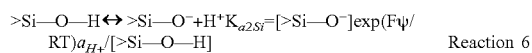

Reaction 6

In these reactions, >Al—O and >Si—O represent Al and Si edge sites. Increased temperature tends to increase the edge site equilibrium constants for Reactions 5 and 6 ($K_{a2}$) thus increasing negative surface charge. A diffuse layer model was manually fit to the 25° C. and 60° C. 0.01-0.1M NaCl kaolinite published surface charge data to calculate the combined effects of temperature and ionic strength on kaolinite edge charge. The fitted model is described by site densities of about 1.15 sites/nm$^2$ (1.92 μmol/m$^2$) for both Al and Si sites, 25° C. pK values for $pK_{a1}$ of about 3.0, for $pK_{a2,Al}$ of about 3.8, and for $pK_{a2,Si}$ of about 7.0, and reaction enthalpies for $\Delta H_{a1}$ of about 0 kJ/mol, $\Delta H_{a2,Al}$ of about 32 kJ/mol, and $\Delta H_{a2,Si}$ of about 32 kJ/mol. The effect of temperature on Reaction 4 may in one aspect be disregarded, or in another aspect may be modeled with a significant decrease in $K_{a1}$ with temperature.

Figure 9:
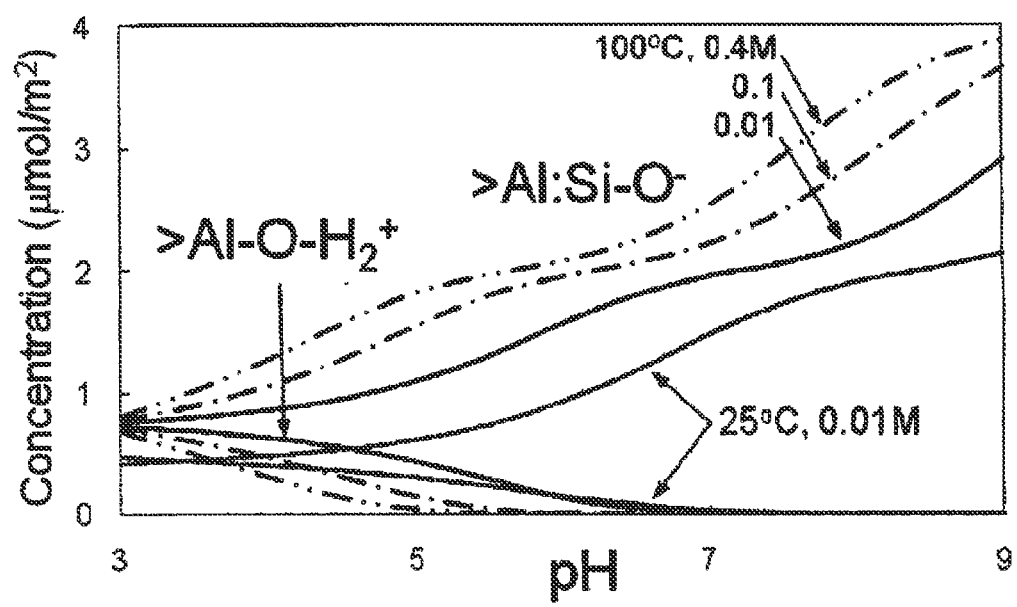
FIG. 9 is a plot of the calculated effect of temperature and ionic strength on kaolinite edge surface species abundances.

FIG. 9 is a plot of the calculated effect of temperature and ionic strength on kaolinite edge surface species abundances. The temperatures considered were 25° C. and 100° C. The ionic strength was adjusted with 0.01, 0.1, and 0.4M NaCl solutions. The concentration of kaolinite in solution was 300 m$^2$/L. In the illustration, >Al:Si—O$^-$ is the sum or combination of >Al—O$^-$ and >Si—O$^-$. As shown in the illustration, there is an increase in negative surface charge (e.g., >Al:Si—O$^-$) with increasing temperature and increasing ionic strength. This suggests that sorption of divalent cations, such as Ca$^{2+}$, to kaolinite edges will be particularly favored at higher, reservoir temperatures. Although Na$^+$ and Cl$^-$ are typically the dominant cation and anion in reservoir brines, Ca$^{2+}$, Mg$^{2+}$, and in some cases SO$_4^{2-}$ may also be considered. For example, Ca$^{2+}$, Mg$^{2+}$, SO$_4^{2-}$, or any combination thereof, may be considered in embodiments when they are present in the brine because of their potential to sorb and locally reverse the charge of mineral surfaces and help, or hinder, bridging of the oil-water and mineral-water interfaces. These results for kaolinite edges may also be relevant to edge charge on other types of clays, and in particular, illites, chlorites, and other clays that possess a basal plane charge of less than 50 milliequivalents per 100 grams.

In some embodiments, reactions between divalent cations, such as Ca$^{2+}$ and Mg$^{2+}$, if present in the oilfield brine, and kaolinite or other clay edge sites may be considered in designing an injectate chemistry. Increased edge acidity at higher temperature tends to increase sorption of such divalent cations when they are present. Alternatively, these reactions need not be included if the oilfield brine lacks these divalent cations, or their levels are considered negligible for the particular implementation.

The ion sorption may be mono-dentate, bi-dentate, or a combination thereof. The mono-dentate sorption may involve one mineral site, while the bi-dentate sorption may involve two nearby mineral sites. At higher pH, there may be adsorption of hydroxylated metal cations, such as CaOH$^+$. Mono-dentate and bi-dentate adsorption of divalent calcium cations (Ca$^{2+}$) and adsorption of hydroxylated metal cations (CaH$^+$) may be expressed by the following Reactions:

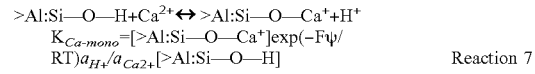

Reaction 7

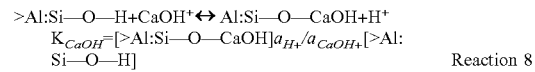

Reaction 8

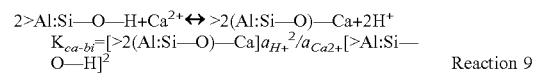

Reaction 9

In parallel, Ca$^{2+}$ can be exchanged for cations on the basal planes of impure natural clays such as kaolinites:

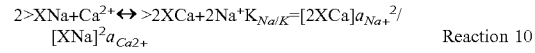

Reaction 10

In Reaction 10, >X represents a negatively charged basal plane site. Basal plane ion exchange tends to be insensitive to pH, while edge sorption tends to depend more strongly on pH. Relatively pure kaolinites interact electrostatically with oil predominantly though their edges. The interactions between kaolinite basal planes and oil-water interfaces tend to be less significant than the edge interactions, unless the kaolinite is particularly impure and possesses a high basal plane charge. In some embodiments, basal plane charge may be considered where it is expected to contribute significantly, or in other embodiments it may be omitted where it is expected to contribute negligibly.

With regard to clay surfaces, oil-clay adhesion may occur on clay basal planes as well as edges. Exchange of charged oil surface groups onto clay basal planes, particularly —NH$^+$ and —COOCa$^+$, may bind oil through the following equilibrium reactions:

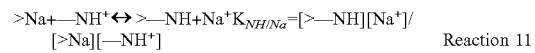

Reaction 11

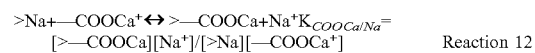

Reaction 12

Oil attraction through —NH$^+$ exchange (Reaction 11) may govern (e.g., may be the dominant electrostatic interaction) when the pH is sufficiently low to fully protonate the oil-N groups (e.g., below pH 6 for the example oil). In addition, reaction 11 may govern when sodium and calcium levels are low, which decreases competition with the —NH$^+$ groups for kaolinite basal plane sites. At very low pH levels, the basal planes may be covered with H$^+$, thereby decreasing oil attraction through —NH$^+$ exchange.

On the other hand, oil attraction through —COOCa$^+$ exchange onto basal planes (Reaction 12) may govern at pH levels (e.g., greater than 6) where a fraction of the oil carboxylate groups become Ca-terminated. Low concentrations of Na$^+$ generally increase oil attraction through —COOCa$^+$ exchange by decreasing competition for surface sites and increasing the activity coefficient of dissolved Ca$^{+2}$. Decreased concentrations of Ca$^{2+}$ generally decrease oil attraction by eliminating exchangeable -COOCa$^+$ groups. Thus, additional oil recovery can be achieved by designing waterfloods that move reactions 11 and 12 from right to left. Accordingly, in some embodiments, decreasing the concentration of Na$^+$ or increasing the concentrations of —NH$^+$ or —COOCa$^+$ reduces oil-clay adhesion, thereby enabling more oil to flow out of the reservoir rock. In certain embodiments, designing the injectate may be implemented by software instructions coded in a program such as PHREEQC. The software instructions may calculate the amounts of —NH and —COOCa bridges for connate brines and candidate injectates to select the most effective injectate. As will be appreciated, analogous reactions to those above for calcium cations ($Ca^{2+}$) may be used to represent magnesium cations ($Mg^{2+}$).

Figure 10:
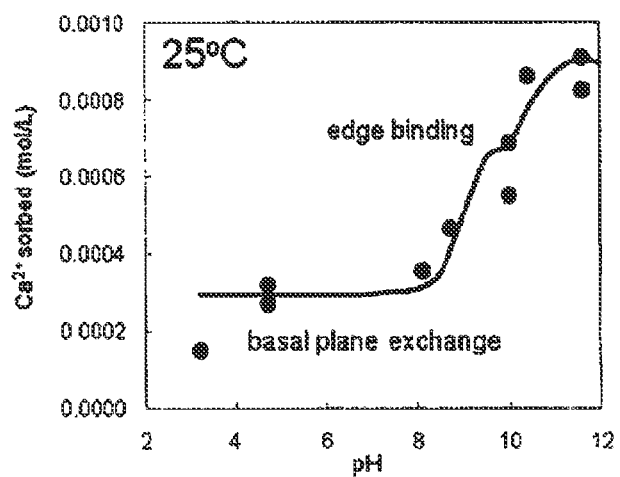
FIG. 10 shows a plot of calcium cation kaolinite sorption data fit with a diffuse layer model.

FIG. 10 shows a plot of 25° C. $Ca^{2+}$ kaolinite sorption data, as represented by data points, fit with a diffuse layer model, as represented by a curve, that includes monodentate edge binding of $Ca^{2+}$ and CaOH and basal plane exchange as represented by Reactions 7, 8, and 10. The curve was calculated with PHREEQC using the diffuse double layer model for kaolinite. Parameters used in the calculations included 50 g/L kaolinite, a total concentration of $Ca^{2+}$ of 1 mmol/L, a basal exchange site density of 0.6 mmol/L, and an edge site density of 2 mmol/L. The log Ks for monodentate sorption of $Ca^{2+}$ (−9.7) and $Ca(OH)^+$ (−4.5) onto >Al—O—H and >Si—O—H sites were used. The constant for Ca/Na exchange (log K=0.8) was used for basal plane exchange.

The pH<8 portion of the curve is believed to primarily represent basal plane exchange of $Ca^{2+}$. Edge sorption of $Ca^{2+}$ is believed to dominate at pH>8 where edge sites are increasingly negatively charged (see e.g., FIG. 9). A similar published $Mg^{2+}$ sorption isotherm parallels the $Ca^{2+}$ isotherm but is displaced to lower pH by approximately 1 unit, indicating higher values of the magnesium binding constants.

The effect of temperature on $Ca^{2+}$ sorption onto kaolinite edges may be inferred from temperature-dependent sorption of other cations. Temperature has been reported to move $Cd^{2+}$ and $Co^{2+}$ kaolinite edge sorption curves 0.8 to 1.8 pH units lower when temperature is raised from 25 to 70° C. Increasing temperature may likewise lead to sorption of $Ca^{2+}$ at lower pH. Sorption enthalpies in the range of 20 kJ/mol to 70 kJ/mol, or about 45 kJ/mol, may be used to estimate sorption $Ca^{2+}$ and $CaOH^+$ at higher temperatures through the van't Hoff equation.

Table 2 lists an example embodiment of kaolinite interface reactions and thermodynamic data that may be used to evaluate charged species on kaolinite interfaces.

faces before and after a waterflooding operation with an injectate. Charged species from the oil interface (e.g. —$NH^+$) may then be paired with oppositely charged species from the kaolinite edge (e.g. >Al:Si—$O^-$) to form electrostatic bridges (e.g., [—$NH^+$][Al:Si—$O^-$]). The more electrostatic bridges formed, the greater the adhesive forces between the oil and the reservoir. Conversely, injectate chemistries that are operable to decrease the number of electrostatic bridges may tend to increase oil mobility and enhance oil recovery.

Figure 11:
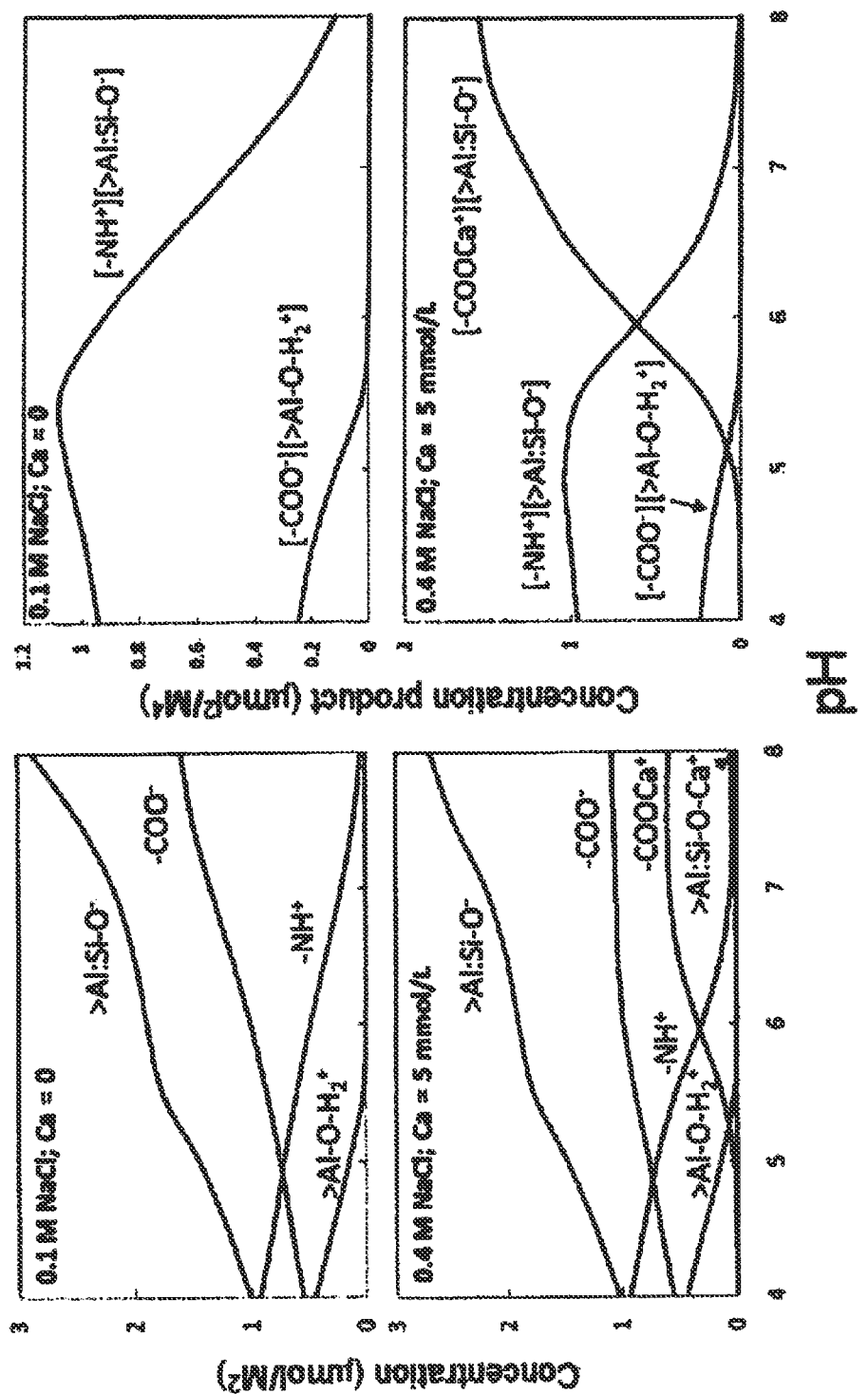
FIG. 11 shows plots of kaolinite-water and oil-water speciation (on the left hand side) and electrostatic bridges (on the right hand side).

FIG. 11 shows plots of kaolinite-water and oil-water speciation at 100° C. (on the left hand side) and electrostatic bridges (on the right hand side) for a 0.1 M NaCl, calcium-free solution (on the top), and 0.4 M NaCl 5 mmol/L Ca solution (on the bottom). The calculation was done for calcium-free 0.1 M NaCl solution as an injectate and a 0.4M NaCl solution initially containing 5 mmol calcium cations as a connate. The plots are constructed for a sandstone (20% kaolinite by volume, the rest quartz) reservoir having a porosity of 0.2; 9:1 (v/v) water:oil. Quartz surface chemistry is not considered in this case because kaolinite, with a much higher specific surface area, is expected to be more significant than the quartz. The two attraction bridges determined to be relatively more important to oil-kaolinite adhesion are the linking of >Al:Si—$O^-$ sites with protonated nitrogen bases (−$NH^+$) and with positively charged calcium carboxylate groups (−$COOCa^+$) at the oil-water interface, as shown by the following reactions:

Reaction 13

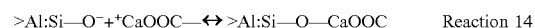

Reaction 14

Coordination of positively charged aluminol sites (>Al—$O$—$H_{2+}$) with carboxylate sites is significant near pH 5.

Figure 12:
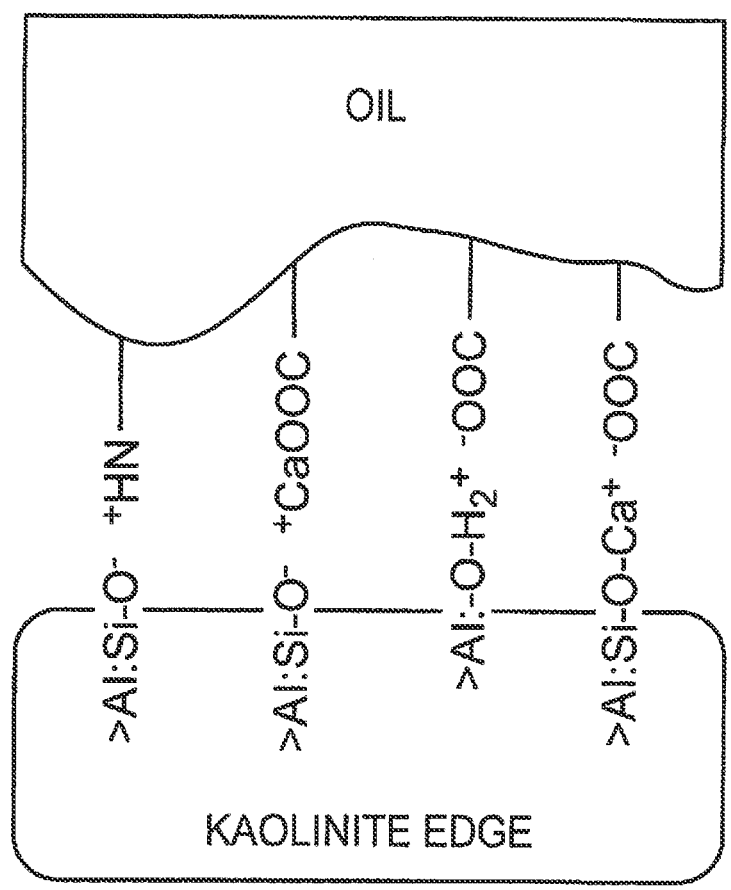
FIG. 12 illustrates four different examples of electrostatic bridges between kaolinite edges and oil.

FIG. 12 illustrates four different examples of electrostatic bridges between kaolinite edges and oil. The rightmost electrostatic bridge between carboxylate (−$COO^-$) and [>Al:Si—O—Ca+] becomes more significant at pH>8.

Figure 13:
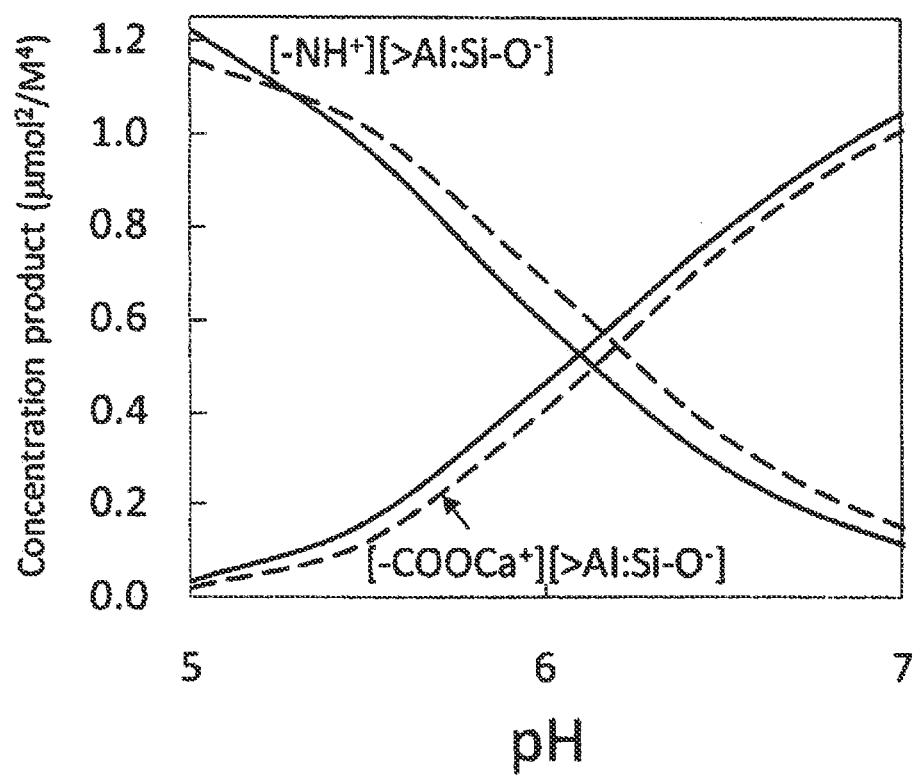
FIG. 13 is a plot illustrating the computed impact of low salinity injection on kaolinite-oil electrostatic bridges as a function of pH.

FIG. 13 is a plot illustrating the calculated impact of low salinity injection on kaolinite-oil electrostatic bridges at 100° C. as a function of pH. In the illustration, the solid lines denote an initial condition of a connate fluid having higher salinity conditions of 0.4 M NaCl and 5 mmol/L $Ca^{2+}$. The

TABLE 2

Example Embodiment of Kaolinite Interface Reactions Representation

| Reaction | 25° C. log K | Enthalpy (kJ/mol) | Site density ($\mu mol/m^2$) |
|---|---|---|---|
| Kaolinite Edges | | | >Al: 1.92, >Si: 1.92 |
| >Al—O—$H_2^+$ ↔ >Al—O—H + $H^+$ | −3.0 | 0 | |
| >Al—O—H ↔ >Al—$O^-$ + $H^+$ | −3.8 | 32 | |
| >Si—O—H ↔ >Si—$O^-$ + $H^+$ | −7.0 | 32 | |
| >Al—O—H + $Ca^{2+}$ ↔ >Al—O—$Ca^+$ + $H^+$ | −9.7 | 45 | |
| >Si—O—H + $Ca^{2+}$ ↔ >Si—O—$Ca^+$ + $H^+$ | −9.7 | 45 | |
| >Al—O—H + $CaOH^+$ ↔ >Al—O—CaOH + $H^+$ | −4.5 | 45 | |
| >Si—O—H + $CaOH^+$ ↔ >Si—O—CaOH + $H^+$ | −4.5 | 45 | |
| Kaolinite Basal Plane | | | |
| 2 > XNa + $Ca^{2+}$ ↔ >2XCa + $2Na^+$ | 0.8 | 7.2 | |

VII. Example Embodiment of Oil-Rock Interface Complexation Reaction Representation Component The reactions and thermodynamic data in Tables 1 and 2 allow calculation of the concentrations of the most abundant charged species on the oil-water and kaolinite-water interfaces before and after a waterflooding operation with an dashed lines denote a subsequent condition after mixing injectate with the connate in a 50:50 mixture. The injectate had a relatively lower salinity of 0.02 M NaCl and 0.1 mmol/L $Ca^{2+}$. These calculations were performed using PHREEQC to initially equilibrate the connate with the kaolinite edges and oil, then mix the resulting fluid with the injectate (in this case in a 50:50 mixture), and then re-equilibrate the resulting mixture of the connate and the injectate with the kaolinite edges and the oil interface.

This plot shows that low salinity injectate decreases electrostatic attraction between oil and kaolinite edges and increases waterflood oil recoveries, which is consistent with observation, particularly at pH 5. For pH less than about 5.3, low salinity injectate tends to decrease the extent of [—NH$^+$][>Al:Si—O$^-$] and [—COOCa$^+$][>Al:Si—O$^-$] electrostatic bridging. At pH greater than about 5.3, low salinity injection tends to decrease the extent of [—COOCa$^+$][>Al:Si—O$^-$] electrostatic bridging. Knowing the primary electrostatic bridges allows the injectate composition to be designed to decrease the number of bridges and increase oil recovery. An embodiment of the present disclosure involves adjusting the pH of the injectate to eliminate electrostatic bridges and increase oil movement. The pH of the injectate may be customized to a particular liquid hydrocarbon, connate fluid, and reservoir properties. For example, in the scenario above the recovery of oils with high numbers of nitrogen bases will be enhanced by lowering the pH below 5.3 at 100° C. Similarly, raising the pH of the injectate when oils have high numbers of carboxylate groups (and the connate fluid has relatively high levels of calcium cations) will enhance recovery.

The results also suggest that low salinity injectate should enhance oil recovery even when few carboxylate sites exist at the oil-water interface by decreasing [>Al:Si—O$^-$][$^+$HN—] bridges. When oil acid numbers are high, Ca$^{2+}$ coordination to carboxylate groups is predicted to be abundant, and the reduction in [>Al:Si—O$^-$][$^+$CaOOC—] attractive sites with low salinity, low Ca waterflooding is expected to enhance oil recovery. The introduction of chemical agents such as EDTA which form strong aqueous complexes with Ca$^{2+}$ may be predicted to enhance oil recovery by eliminating [>Al:Si—O$^-$][$^+$CaOOC—] bridges.

VIII. Example Embodiment of Rock Interface Reaction Representation Component for Carbonate-Type Reservoirs As previously discussed, some subterranean reservoirs are carbonate-type subterranean reservoirs (e.g., the rock formation includes predominantly limestone, calcite, dolomite, mineral carbonates, etc., and combinations thereof). This section describes an example embodiment of a rock interface reaction representation component suitable for such carbonate-type subterranean reservoirs.

The rock interface reaction representation component suitable for the carbonate-type subterranean reservoir may model surface chemistry of the more significant rocks or minerals found in the carbonate-type reservoir (e.g., calcite and dolomite). In one illustrative example embodiment, such a model may include the following reactions:

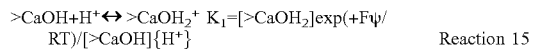
Reaction 15

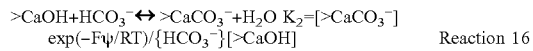
Reaction 16

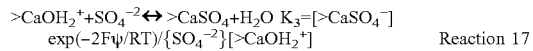
Reaction 17

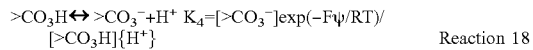
Reaction 18

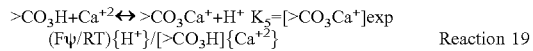
Reaction 19

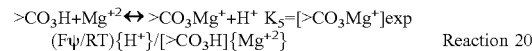
Reaction 20

An example embodiment of a rock interface reaction representation component may use these reactions to compute the concentration of charged groups on the reservoir rock surface. Alternative embodiments of components may include fewer, more, or different reactions, as appropriate for the particular implementation.

In some embodiments, an oil interface reaction representation component similar or analogous to those described above may be used to compute the oil interface charged surface species as previously described. If desired, the component may be modified to account for reactions specific to or more prevalent due to the carbonate-type reservoir (e.g., reactions between oil acids and bases and carbonate or bicarbonate ions). For example, in limestone reservoirs, the governing reactions may be between —CaOH$_2^+$ and —COO$^-$ and —CO$_3^-$ and —NH$^+$. Heavily weighting the oil interface reaction component with respect to the [—CaOH$_2^+$][—COO$^-$] and/or [—CO$_3^-$][—NH$^+$] electrostatic bridges may be sufficient to model oil-limestone interactions to design an injectate chemistry.

In some embodiments, an oil-rock interface complexation reaction representation component similar or analogous to those described above, although taking into account the different charged species on the reservoir rock as determined by using any one or a combination of Reactions 15-20, may be used to evaluate the complexation reactions between charged species associated with the rock interfaces and the oil interfaces. This may be used to calculate the primary electrostatic bridges between the metal carbonate and oil surfaces. If desired, PHREEQC or another reaction evaluation component may be used to take into consideration carbonate-type reservoir rock interface dissolution and precipitation models, etc. Alternatively, dissolution/precipitation factors may be omitted depending upon the implementation. Then, an injectate may be designed as previously described to reduce the extent of such electrostatic bridges and enhance oil recovery from the carbonate-type reservoir.

For example, various alternate embodiments of injectate design systems are also contemplated. Additional aspects may be added or some of the aspects included in the model may be omitted for simplicity, as appropriate for the particular implementation. While equilibrium reactions have primarily been represented in the above description, other embodiments may incorporate kinetic or rate limiting expressions (e.g., to represent slow desorption affects on oil mobility). Additionally, mass transfer limiting expressions, solid dissolution expressions, and other expressions affecting the rate or extent of reactions may also be included.

IX. Injectate Testing Protocol

Before deploying the designed injectate into a live waterflooding operation, it may be desirable to test the effectiveness of the injectate on a test sample of oil and rock. As noted earlier, it is desirable for the injectate to sorb (e.g., absorb or adsorb) onto the reservoir rock, thereby breaking electrostatic bridges between the oil and the rock and improving the recovery of oil. Accordingly, the present disclosure provides a test procedure that may estimate the degree of sorption between the injectate and the reservoir rock. In certain testing procedures described herein, bitumen may be used as a representative sample of the oil. Bitumen, as a semi-solid, is generally more amenable to sorption testing procedures. A bitumen sample may be prepared to have surface characteristics (e.g., ratio of surface acids to surface bases) that are substantially similar to the reservoir oil. Determining the sorption between the injectate and the bitumen sample may be representative of the sorption between the injectate and the reservoir rock. Although the following procedure is directed toward bitumen, it should be noted that other materials may be used as an oil-representative material (e.g., liquid, semi-solid, or solid hydrocarbons).

Figure 14:
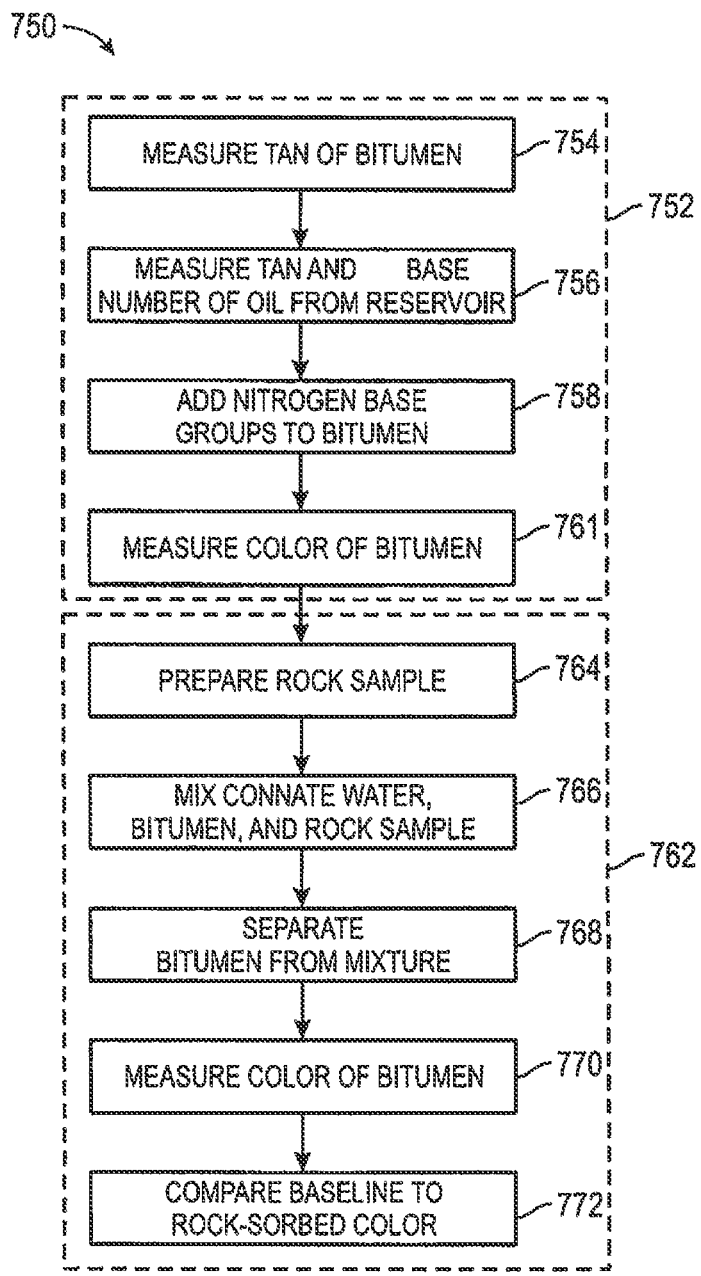
FIG. 14 is a method illustrating a protocol to estimate sorption between reservoir rock and liquid hydrocarbon upon introduction of an injectate.

Turning now to FIG. 14, a method 750 of testing the sorption of the designed injectate to bitumen is illustrated. It should be noted that the method 750 may be performed by a lab technician, but certain steps may be performed by various laboratory equipment, such as centrifuges, spectrophotometers, and the like. Further, fully automated testing procedures are also presently contemplated. The method includes preparing a bitumen sample, at block 752. Preparing the bitumen sample may include measuring the surface acidity (e.g., total acid number, or TAN) of the bitumen, at block 754. The TAN of the bitumen may be measured, for example, using procedures from the American Society for Testing and Materials (ASTM), e.g., ASTM 664. The method includes measuring a TAN of oil from the reservoir, at block 756, which may involve the aforementioned ASTM procedures.

As noted earlier, it is desirable to substantially match the surface acid/base ratio of the modified bitumen to the surface acid/base ratio of the oil. To this end, the method includes adding a predetermined amount of nitrogen base groups (e.g., alkylamines) to the bitumen, at block 758. Advantageously, adding the nitrogen base groups substantially equalizes the surface acid/base compositions of the bitumen to that of the reservoir oil. The nitrogen base group is chemically tethered to the bitumen by a binder. In other words, the addition of the binder results in chemical reactions between the bitumen and the nitrogen base groups. In certain embodiments, the binder may be an ester (e.g., carbonate ester, boronic ester), an ether (e.g., silyl ether), a solvent containing one or more nitrogen base groups linked to a hydrophobic hydrocarbon tail, or any combination thereof. As will be appreciated, bitumen surfaces include primarily carboxylate groups, whereas reservoir oil contains both carboxylate and nitrogen groups. Adding the nitrogen base groups enables the modified bitumen surface to mimic the surface behavior of reservoir oil. It may also be advantageous for to verify that the TAN of the modified bitumen and the TAN of the oil are substantially equal and the base number of the modified bitumen and the base number of the oil are substantially equal.

The method includes measuring a color of the nitrogen-tethered bitumen using a spectrophotometer in order to establish a baseline color, at block 761. For example, bitumen has a generally black color, which may correspond to a wavelength outside of the range of approximately 390 to 750 nanometers.

After the bitumen sample is prepared (block 752), the method may include testing the sorption of the designed injectate to the nitrogen-tethered bitumen, at block 762. Testing the injectate may include preparing a reservoir rock sample, at block 764. The rock sample may be prepared, for example, by grinding the reservoir rock into a powder (e.g., with an average particle size less than 10 microns or a surface area greater than 1 $m^2$ per gram). It should be noted that the reservoir rock may be processed into various sizes and may include, for example, granules, gravel, pebbles, and the like. After preparing the rock sample, the method includes mixing the bitumen and rock powder along with connate water, at block 766. These components may be mixed in predetermined amounts. In addition, the ratios of bitumen, rock powder, and connate water may be designed to replicate downhole conditions. For example, approximately 1 gram of bitumen granules (e.g., greater than 1 mm in diameter), 1 gram of reservoir rock powder, and 1 liter of connate water may be mixed and stirred for at least 24 hours. The mixture is thus allowed to equilibrate. In certain embodiments, the method may include measuring a physico-chemical property of the mixture (e.g., TAN, color, etc.) and waiting until the property reaches a steady-state before proceeding with the testing procedure. Depending on the selected physico-chemical property, the time to equilibrate may be on the order of minutes, hours, or days.

The method includes separating the equilibrated bitumen from the remainder of the mixture, at block 768. Conventional methods for separation, such as filtration, centrifugation, flotation, or any combination thereof, may be used. The method includes measuring a color of the equilibrated bitumen using a spectrophotometer, at block 770. Differences in color between the equilibrated bitumen (at block 770) and the baseline sample (at block 761) quantify the extent of sorption between the reservoir rock and the bitumen. As noted earlier, bitumen is primarily black. However, when reservoir minerals sorb to the bitumen, the bitumen surface turns grey. In general, it is desirable for fewer minerals to sorb to the bitumen, indicating a greater repulsion between the reservoir rock and the reservoir oil. In other words, a blacker bitumen surface may correlate with greater oil recovery. Thus, the method may include comparing the color of the equilibrated bitumen to the color of the baseline bitumen to determine the effectiveness of the designed injectate, at block 772. In addition, the method may repeat the steps of blocks 766, 768, 770, and 772 to test multiple candidate injectates on a single bitumen sample.

In certain embodiments, determining the extent of sorption may involve washing the bitumen and measuring a concentration of any suspended solids (e.g., reservoir rock powder). A greater concentration of dissolved solids indicates a greater repulsion between the reservoir rock and the reservoir oil, and may generally correlate with improved oil recovery.

X. Effect of Injectate on Oil Recovery

Figure 15:
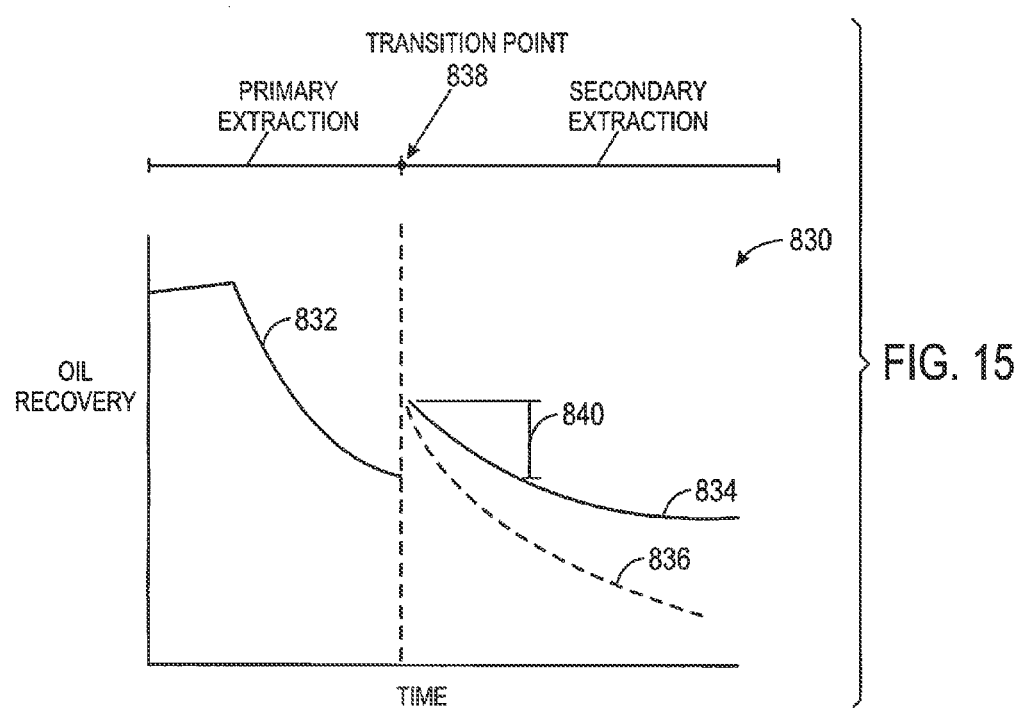
FIG. 15 is a plot illustrating an example primary extraction decline curve, an example secondary extraction decline curve representative of the use of an injectate produced according to the present disclosure, and an example secondary extraction decline curve produced using a typical injectate.

As explained above, the composition of the injectate may be operable to reduce electrostatic interactions between the reservoir rock and the oil, thereby improving oil secondary oil recovery. FIG. 15 illustrates an oil recovery timeline 830 including a primary decline curve 832 and two secondary decline curves 834 and 836. A transition point 838 between primary extraction and secondary extraction is indicative of the time when the designed injectate is introduced to the oil recovery operation. As shown, the recovery of oil gradually decreases over time, but may be improved through the use of an injectate designed in accordance with present embodiments—i.e., an injectate that may reduce the electrostatic interactions between the reservoir rock and the oil.

When the injectate chemistry is not designed to reduce electrostatic interactions between the reservoir rock and the oil, the secondary extraction may result in the dashed decline curve 836. However, when the injectate chemistry is operable to reduce these electrostatic interactions, the oil recovery is improved, as indicated by the decline curve 834. As noted earlier, the design of the injectate chemistry may be iterative, and may change based on the dynamic physico-chemical data of the secondary extraction.

As illustrated, the introduction of the designed injectate may result in a stepwise increase 540 in oil production. The magnitude of the increase 540 may be based on inherent properties of the reservoir, the oil, the connate water, or any combination thereof, and, as a result, may vary between oil recovery operations. Thus, certain reservoirs may not be as responsive to the introduction of the injectate and may have a smaller or no stepwise increase 540 in oil production.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A method of designing an injectate for recovering a liquid hydrocarbon from a reservoir rock, comprising:
    measuring physico-chemical data representative of electrostatic interactions between the liquid hydrocarbon and the reservoir rock;
    selecting a composition of the injectate based on the physico-chemical data, wherein the composition comprises at least one additive, or at least one removable component, or both;
    preparing the injectate by mixing water with the at least one additive, or by removing a portion of the at least one removable component from the water, or both;
    estimating an extent of sorption between the reservoir rock and the liquid hydrocarbon in response to the injectate; and
    designing the injectate to decrease the extent of sorption between the reservoir rock and the liquid hydrocarbon;
    wherein estimating the extent of sorption comprises:
    preparing an oil sample that is representative of the liquid hydrocarbon;
    measuring a baseline color of the oil sample;
    preparing a mixture of the oil sample, the injectate, and connate water;
    allowing the mixture to equilibrate;
    measuring an equilibrium color of the mixture; and
    comparing the baseline color to the equilibrium color to estimate the extent of sorption between the reservoir rock and the liquid hydrocarbon.

2. The method of claim 1, comprising selecting the composition of the injectate based at least in part on an acid number and a base number of the liquid hydrocarbon, a pH, salinity, or calcium concentration of connate water, an estimated expansion of a swelling clay of the reservoir rock, an extent of mineral dissolution of the reservoir rock in response to the injectate, or any combination thereof.

3. The method of claim 1, wherein the oil sample comprises bitumen.

4. The method of claim 1, wherein preparing the oil sample comprises crushing the bitumen into a powder form.

5. The method of claim 1, wherein preparing the oil sample comprises:
    measuring an acid number of the oil sample;
    measuring a base number of the oil sample;
    measuring an acid number of the liquid hydrocarbon;
    measuring a base number of the liquid hydrocarbon; and
    adding nitrogen base groups to the oil sample to substantially equalize respective acid to base number ratios of the oil sample and the liquid hydrocarbon.

6. A method of selecting an injectate for recovering a liquid hydrocarbon from a reservoir rock, comprising:
    preparing a plurality of injectates by mixing water with at least one additive, or by removing a portion of at least one removable component from the water, or both;
    estimating an extent of sorption between the reservoir rock and the liquid hydrocarbon in response to each injectate of the plurality of injectates; and
    selecting a candidate injectate from the plurality of injectates based on a desired sorption between the reservoir rock and the liquid hydrocarbon;
    wherein estimating the extent of sorption comprises:
    preparing an oil sample that is representative of the liquid hydrocarbon;
    preparing a mixture of the oil sample, the injectate, and connate water;
    separating the oil sample from the injectate and connate water;
    washing the oil sample with a solvent;
    measuring a concentration of dissolved solids within the solvent; and
    estimating the extent of sorption between the reservoir rock and the liquid hydrocarbon using the concentration of dissolved solids; and
    wherein the oil sample comprises bitumen; and
    wherein preparing the oil sample comprises crushing the bitumen into a powder form.

7. The method of claim 6, wherein preparing the plurality of injectates comprises selecting a composition of the injectate based at least in part on an acid number and a base number of the liquid hydrocarbon, a pH, salinity, or calcium concentration of connate water, an estimated expansion of a swelling clay of the reservoir rock, an extent of mineral dissolution of the reservoir rock in response to the injectate, or any combination thereof.

8. The method of claim 6, wherein preparing the oil sample comprises:
    measuring a concentration of nitrogen base groups in the liquid hydrocarbon; and
    adding nitrogen base groups to the bitumen to substantially equalize the concentration of nitrogen base groups in the bitumen and the liquid hydrocarbon.

* * * * *